US010957514B2

United States Patent
Singhal et al.

(10) Patent No.: US 10,957,514 B2
(45) Date of Patent: *Mar. 23, 2021

(54) APPARATUS AND METHOD FOR DEPOSITION AND ETCH IN GAP FILL

(71) Applicant: Lam Research Corporation, Fremont, CA (US)

(72) Inventors: Akhil Singhal, Portland, OR (US); Patrick A. van Cleemput, West Linn, OR (US); Martin E. Freeborn, San Jose, CA (US); Bart J. van Schravendijk, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/453,237

(22) Filed: Jun. 26, 2019

(65) Prior Publication Data

US 2019/0385820 A1    Dec. 19, 2019

Related U.S. Application Data

(60) Continuation of application No. 15/683,397, filed on Aug. 22, 2017, now Pat. No. 10,373,806, which is a
(Continued)

(51) Int. Cl.
*H01J 37/32* (2006.01)
*C23C 16/50* (2006.01)
(Continued)

(52) U.S. Cl.
CPC ...... *H01J 37/32091* (2013.01); *C23C 16/045* (2013.01); *C23C 16/4554* (2013.01);
(Continued)

(58) Field of Classification Search
None
See application file for complete search history.

(56) References Cited

U.S. PATENT DOCUMENTS

| 4,500,563 A | 2/1985 | Ellenberger et al. |
| 5,094,984 A | 3/1992 | Liu et al. |

(Continued)

FOREIGN PATENT DOCUMENTS

| CN | 1732288 A | 2/2006 |
| CN | 1841676 A | 10/2006 |

(Continued)

OTHER PUBLICATIONS

U.S. Office Action dated Mar. 15, 2013 issued in U.S. Appl. No. 13/084,399.

(Continued)

*Primary Examiner* — Zandra V Smith
*Assistant Examiner* — Lawrence C Tynes, Jr.
(74) *Attorney, Agent, or Firm* — Weaver Austin Villeneuve & Sampson LLP

(57) ABSTRACT

Provided are apparatuses and methods for performing deposition and etch processes in an integrated tool. An apparatus may include a plasma processing chamber that is a capacitively-coupled plasma reactor, and the plasma processing chamber can include a showerhead that includes a top electrode and a pedestal that includes a bottom electrode. The apparatus may be configured with an RF hardware configuration so that an RF generator may power the top electrode in a deposition mode and power the bottom electrode in an etch mode. In some implementations, the apparatus can include one or more switches so that at least an HFRF generator is electrically connected to the showerhead in a deposition mode, and the HFRF generator and an (Continued)

LFRF generator is electrically connected to the pedestal and the showerhead is grounded in the etch mode.

7 Claims, 11 Drawing Sheets

Related U.S. Application Data division of application No. 15/199,608, filed on Jun. 30, 2016, now Pat. No. 9,773,643.

(51) Int. Cl.
*C23C 16/455* (2006.01)
*C23C 16/04* (2006.01)
*C23C 16/509* (2006.01)

(52) U.S. Cl.
CPC .. *C23C 16/45536* (2013.01); *C23C 16/45544* (2013.01); *C23C 16/45565* (2013.01); *C23C 16/50* (2013.01); *C23C 16/5096* (2013.01); *H01J 37/3244* (2013.01); *H01J 37/32174* (2013.01); *H01J 37/32449* (2013.01); *H01J 37/32568* (2013.01); *H01J 37/32577* (2013.01); *H01J 37/32715* (2013.01); *H01J 2237/334* (2013.01); *H01J 2237/3321* (2013.01)

(56) References Cited

U.S. PATENT DOCUMENTS

| | | |
|---|---|---|
| 5,223,443 A | 6/1993 | Chinn et al. |
| 5,318,928 A | 6/1994 | Gegenwart et al. |
| 5,496,608 A | 3/1996 | Matsuda et al. |
| 5,593,914 A | 1/1997 | Evans, Jr. et al. |
| 5,670,432 A | 9/1997 | Tsai |
| 5,856,003 A | 1/1999 | Chiu |
| 5,874,368 A | 2/1999 | Laxman et al. |
| 5,916,365 A | 6/1999 | Sherman |
| 5,932,286 A | 8/1999 | Beinglass et al. |
| 6,069,058 A | 5/2000 | Hong |
| 6,100,202 A | 8/2000 | Lin et al. |
| 6,156,149 A | 12/2000 | Cheung et al. |
| 6,218,293 B1 | 4/2001 | Kraus et al. |
| 6,270,572 B1 | 8/2001 | Kim et al. |
| 6,346,741 B1 | 2/2002 | Van Buskirk et al. |
| 6,391,803 B1 | 5/2002 | Kim et al. |
| 6,399,221 B1 | 6/2002 | Marks et al. |
| 6,416,822 B1 | 7/2002 | Chiang et al. |
| 6,428,859 B1 | 8/2002 | Chiang et al. |
| 6,465,272 B1 | 10/2002 | Davis, Jr. et al. |
| 6,468,924 B2 | 10/2002 | Lee et al. |
| 6,482,726 B1 | 11/2002 | Aminpur et al. |
| 6,509,601 B1 | 1/2003 | Lee et al. |
| 6,528,430 B2 | 3/2003 | Kwan et al. |
| 6,551,893 B1 | 4/2003 | Zheng et al. |
| 6,569,501 B2 | 5/2003 | Chiang et al. |
| 6,576,053 B1 | 6/2003 | Kim et al. |
| 6,602,784 B2 | 8/2003 | Sneh |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic et al. |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,097,886 B2 | 8/2006 | Moghadam et al. |
| 7,109,129 B1 | 9/2006 | Papasouliotis |
| 7,115,166 B2 | 10/2006 | Vaartstra et al. |
| 7,115,528 B2 | 10/2006 | Vaartstra et al. |
| 7,122,222 B2 | 10/2006 | Xiao et al. |
| 7,122,464 B2 | 10/2006 | Vaarstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,235,484 B2 | 6/2007 | Nguyen et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,745,346 B2 | 6/2010 | Hausmann et al. |
| 7,758,920 B2 | 7/2010 | Hasebe et al. |
| 7,776,733 B2 | 8/2010 | Hasegawa |
| 7,790,633 B1 | 9/2010 | Tarafdar et al. |
| 7,825,039 B2 | 11/2010 | Takahashi et al. |
| 7,863,190 B1 | 1/2011 | Papasouliotis et al. |
| 7,906,168 B2 | 3/2011 | Hasebe et al. |
| 7,919,416 B2 | 4/2011 | Lee et al. |
| 7,923,068 B2 | 4/2011 | Dickey et al. |

(56) References Cited

U.S. PATENT DOCUMENTS

| | | |
|---|---|---|
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,338,312 B2 | 12/2012 | Sato et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,846,484 B2 | 9/2014 | Lee et al. |
| 8,956,983 B2 | 2/2015 | Swaminathan et al. |
| 8,999,859 B2 | 4/2015 | Swaminathan et al. |
| 9,023,693 B1 | 5/2015 | Lin et al. |
| 9,076,646 B2 | 7/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,406,693 B1 | 8/2016 | Pang et al. |
| 9,502,238 B2 | 11/2016 | Danek et al. |
| 9,564,312 B2 | 2/2017 | Henri et al. |
| 9,570,274 B2 | 2/2017 | Swaminathan et al. |
| 9,570,290 B2 | 2/2017 | Swaminathan et al. |
| 9,611,544 B2 | 4/2017 | Lavoie et al. |
| 9,627,221 B1* | 4/2017 | Zaitsu ............... H01L 21/31116 |
| 9,673,041 B2 | 6/2017 | Swaminathan et al. |
| 9,685,320 B2 | 6/2017 | Kang et al. |
| 9,773,643 B1* | 9/2017 | Singhal ................. C23C 16/045 |
| 9,786,570 B2 | 10/2017 | Kang et al. |
| 9,793,110 B2 | 10/2017 | Kang et al. |
| 9,875,891 B2 | 1/2018 | Henri et al. |
| 9,892,917 B2 | 2/2018 | Swaminathan et al. |
| 9,997,357 B2 | 6/2018 | Arghavani et al. |
| 10,008,428 B2 | 6/2018 | Kang et al. |
| 10,037,884 B2 | 7/2018 | Ou et al. |
| 10,043,655 B2 | 8/2018 | Swaminathan et al. |
| 10,043,657 B2 | 8/2018 | Swaminathan et al. |
| 10,062,563 B2 | 8/2018 | Kumar et al. |
| 10,269,559 B2 | 4/2019 | Abel et al. |
| 10,361,076 B2 | 7/2019 | Kang et al. |
| 10,373,806 B2 | 8/2019 | Singhal et al. |
| 10,559,468 B2 | 2/2020 | Arghavani et al. |
| 10,804,099 B2 | 10/2020 | Henri et al. |
| 2002/0066411 A1 | 6/2002 | Chiang et al. |
| 2002/0076507 A1 | 6/2002 | Chiang et al. |
| 2002/0153101 A1 | 10/2002 | Nguyen et al. |
| 2002/0175393 A1 | 11/2002 | Baum et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0200917 A1 | 10/2003 | Vaartstra |
| 2003/0216006 A1 | 11/2003 | Li et al. |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0129212 A1 | 7/2004 | Gadgil et al. |
| 2004/0146644 A1 | 7/2004 | Xiao et al. |
| 2004/0157472 A1 | 8/2004 | Sugino et al. |
| 2004/0171280 A1 | 9/2004 | Conley, Jr. et al. |
| 2004/0219746 A1 | 11/2004 | Vaartstra et al. |
| 2004/0219784 A1 | 11/2004 | Kang et al. |
| 2004/0231799 A1 | 11/2004 | Lee et al. |
| 2005/0005851 A1 | 1/2005 | Keshner et al. |
| 2005/0009368 A1 | 1/2005 | Vaartsra |
| 2005/0042865 A1 | 2/2005 | Cabral et al. |
| 2005/0079661 A1 | 4/2005 | Cho et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0142795 A1 | 6/2005 | Ahn et al. |
| 2005/0158983 A1 | 7/2005 | Hoshi et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0276930 A1 | 12/2005 | Gates et al. |
| 2005/0282346 A1 | 12/2005 | Barth et al. |
| 2005/0287775 A1 | 12/2005 | Hasebe et al. |
| 2006/0003557 A1 | 1/2006 | Cabral et al. |
| 2006/0009041 A1 | 1/2006 | Iyer et al. |
| 2006/0030148 A1 | 2/2006 | Seutter et al. |
| 2006/0032442 A1 | 2/2006 | Hasebe |
| 2006/0032443 A1 | 2/2006 | Hasebe et al. |
| 2006/0084283 A1 | 4/2006 | Paranjpe et al. |
| 2006/0088985 A1 | 4/2006 | Haverkort et al. |
| 2006/0105106 A1 | 5/2006 | Balseanu et al. |
| 2006/0165890 A1 | 7/2006 | Kaushal et al. |
| 2006/0183055 A1 | 8/2006 | O'Neill et al. |
| 2006/0199357 A1 | 9/2006 | Wan et al. |
| 2006/0216418 A1 | 9/2006 | Matsuura |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0026540 A1 | 2/2007 | Nooten et al. |
| 2007/0032047 A1 | 2/2007 | Hasebe et al. |
| 2007/0048455 A1 | 3/2007 | Koh et al. |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0116887 A1 | 5/2007 | Faguet |
| 2007/0119370 A1 | 5/2007 | Ma et al. |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0243693 A1 | 10/2007 | Nemani et al. |
| 2007/0245959 A1* | 10/2007 | Paterson ........... H01J 37/32091 |
| | | 118/723 I |
| 2007/0251444 A1 | 11/2007 | Gros-Jean et al. |
| 2007/0259110 A1 | 11/2007 | Mahajani et al. |
| 2007/0281495 A1 | 12/2007 | Mallick et al. |
| 2007/0298585 A1 | 12/2007 | Lubomirsky et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |

(56) References Cited

U.S. PATENT DOCUMENTS

| | | |
|---|---|---|
| 2008/0085610 A1 | 4/2008 | Wang et al. |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0207007 A1 | 8/2008 | Thridandam et al. |
| 2008/0213479 A1 | 9/2008 | Chou et al. |
| 2008/0233762 A1 | 9/2008 | Hong |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0155968 A1 | 6/2009 | Min et al. |
| 2009/0163012 A1 | 6/2009 | Clark et al. |
| 2009/0191687 A1 | 7/2009 | Hong et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2009/0286381 A1 | 11/2009 | van Schravendijk et al. |
| 2010/0022099 A1 | 1/2010 | Van Nooten et al. |
| 2010/0025824 A1 | 2/2010 | Chen et al. |
| 2010/0048011 A1 | 2/2010 | Yeh et al. |
| 2010/0051578 A1 | 3/2010 | Chang et al. |
| 2010/0051579 A1 | 3/2010 | Kobayashi |
| 2010/0078316 A1 | 4/2010 | Edakawa et al. |
| 2010/0096687 A1 | 4/2010 | Balseanu et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0120262 A1 | 5/2010 | Vorsa et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0144162 A1 | 6/2010 | Lee et al. |
| 2010/0167555 A1 | 7/2010 | Maula et al. |
| 2010/0190353 A1 | 7/2010 | Nguyen et al. |
| 2010/0197129 A1 | 8/2010 | Ishikawa |
| 2010/0216268 A1 | 8/2010 | Katayama et al. |
| 2010/0221925 A1 | 9/2010 | Lee et al. |
| 2010/0244114 A1 | 9/2010 | Konno et al. |
| 2010/0255218 A1 | 10/2010 | Oka et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0121354 A1 | 5/2011 | Schmid et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0171775 A1 | 7/2011 | Yamamoto et al. |
| 2011/0176967 A1 | 7/2011 | Okuda et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0064682 A1 | 3/2012 | Jang et al. |
| 2012/0074844 A1 | 3/2012 | York et al. |
| 2012/0077349 A1 | 3/2012 | Li et al. |
| 2012/0086048 A1 | 4/2012 | Park et al. |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0043512 A1 | 2/2013 | Huang et al. |
| 2013/0058161 A1 | 3/2013 | Yamanaka et al. |
| 2013/0058162 A1 | 3/2013 | Yamanaka et al. |
| 2013/0065404 A1 | 3/2013 | Weidman et al. |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |
| 2013/0323923 A1 | 12/2013 | Koehler et al. |
| 2013/0344248 A1 | 12/2013 | Clark |
| 2014/0030444 A1 | 1/2014 | Swaminathan et al. |
| 2014/0051262 A9 | 2/2014 | Lavoie et al. |
| 2014/0087066 A1 | 3/2014 | Wang et al. |
| 2014/0106574 A1* | 4/2014 | Kang ............... H01L 21/67201 438/778 |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0170853 A1 | 6/2014 | Shamma et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0239462 A1 | 8/2014 | Shamma et al. |
| 2014/0262038 A1 | 9/2014 | Wang et al. |
| 2014/0264555 A1 | 9/2014 | Ahn et al. |
| 2014/0273428 A1 | 9/2014 | Shero et al. |
| 2014/0273528 A1 | 9/2014 | Niskanen et al. |
| 2014/0295084 A1 | 10/2014 | Shirai et al. |
| 2014/0302686 A1 | 10/2014 | Pan et al. |
| 2015/0041867 A1 | 2/2015 | Han |
| 2015/0048740 A1 | 2/2015 | Valcore, Jr. et al. |
| 2015/0093902 A1 | 4/2015 | Huang et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2015/0294905 A1 | 10/2015 | Wu et al. |
| 2016/0020092 A1 | 1/2016 | Kang et al. |
| 2016/0064211 A1 | 3/2016 | Swaminathan et al. |
| 2016/0079037 A1 | 3/2016 | Hirano et al. |
| 2016/0118246 A1 | 4/2016 | Kang et al. |
| 2016/0148800 A1 | 5/2016 | Henri et al. |

(56) References Cited

U.S. PATENT DOCUMENTS

| | | |
|---|---|---|
| 2016/0148806 A1 | 5/2016 | Henri et al. |
| 2016/0155676 A1 | 6/2016 | Kang et al. |
| 2016/0163539 A9 | 6/2016 | Kang et al. |
| 2016/0163972 A1 | 6/2016 | Swaminathan et al. |
| 2016/0240428 A1 | 8/2016 | Tung et al. |
| 2016/0251756 A1 | 9/2016 | Lansalot-Matras et al. |
| 2016/0260584 A1* | 9/2016 | Marakhtanov .... H01J 37/32183 |
| 2016/0293385 A1 | 10/2016 | Kapoor et al. |
| 2016/0293398 A1 | 10/2016 | Danek et al. |
| 2016/0293838 A1 | 10/2016 | Swaminathan et al. |
| 2016/0322215 A1 | 11/2016 | Shaikh |
| 2016/0322371 A1 | 11/2016 | Yonemochi |
| 2016/0329206 A1 | 11/2016 | Kumar et al. |
| 2016/0329423 A1 | 11/2016 | Kawahara et al. |
| 2016/0336178 A1 | 11/2016 | Swaminathan et al. |
| 2016/0340782 A1 | 11/2016 | Chandrasekharan et al. |
| 2016/0365425 A1 | 12/2016 | Chen et al. |
| 2016/0379826 A9 | 12/2016 | Arghavani et al. |
| 2017/0009346 A1 | 1/2017 | Kumar et al. |
| 2017/0092735 A1 | 3/2017 | Hashemi et al. |
| 2017/0103891 A1 | 4/2017 | Lee et al. |
| 2017/0110364 A1 | 4/2017 | Song et al. |
| 2017/0110533 A1 | 4/2017 | Huang et al. |
| 2017/0117134 A1 | 4/2017 | Henri et al. |
| 2017/0117150 A1 | 4/2017 | Liao et al. |
| 2017/0140926 A1 | 5/2017 | Pore et al. |
| 2017/0148628 A1 | 5/2017 | Swaminathan et al. |
| 2017/0170026 A1 | 6/2017 | Hudson et al. |
| 2017/0226637 A1 | 8/2017 | Lubomirsky et al. |
| 2017/0263450 A1 | 9/2017 | Swaminathan et al. |
| 2017/0316988 A1 | 11/2017 | Kang et al. |
| 2017/0323786 A1 | 11/2017 | Kang et al. |
| 2018/0005801 A1 | 1/2018 | Singhal et al. |
| 2018/0005814 A1 | 1/2018 | Kumar et al. |
| 2018/0061628 A1 | 3/2018 | Ou et al. |
| 2018/0138028 A1 | 5/2018 | Henri et al. |
| 2018/0247875 A1 | 8/2018 | Kang et al. |
| 2018/0269061 A1 | 9/2018 | Arghavani et al. |
| 2018/0323057 A1 | 11/2018 | Kumar et al. |
| 2019/0080903 A1 | 3/2019 | Abel et al. |
| 2019/0311897 A1 | 10/2019 | Kang et al. |
| 2019/0385850 A1 | 12/2019 | Arghavani et al. |

FOREIGN PATENT DOCUMENTS

| | | |
|---|---|---|
| CN | 1926668 A | 3/2007 |
| CN | 101006195 A | 7/2007 |
| CN | 101255548 A | 9/2008 |
| CN | 101328578 A | 12/2008 |
| CN | 101378007 A | 3/2009 |
| CN | 101416293 A | 4/2009 |
| CN | 101535524 A | 9/2009 |
| CN | 101736326 A | 6/2010 |
| CN | 101889331 A | 11/2010 |
| CN | 102005462 A | 4/2011 |
| CN | 102191479 A | 9/2011 |
| CN | 102471885 A | 5/2012 |
| CN | 102687249 A | 9/2012 |
| CN | 102906304 A | 1/2013 |
| CN | 103137864 A | 6/2013 |
| CN | 103928396 A | 7/2014 |
| CN | 105391427 A | 3/2016 |
| CN | 105719954 A | 6/2016 |
| EP | 0 277 766 | 8/1988 |
| EP | 0 541 212 | 5/1993 |
| EP | 1 081 754 A2 | 7/2001 |
| EP | 1 703 552 A2 | 9/2006 |
| EP | 2 278 046 | 1/2011 |
| JP | S48-043472 A | 6/1973 |
| JP | H02-093071 A | 4/1990 |
| JP | H03-011635 | 1/1991 |
| JP | 05-226279 | 9/1993 |
| JP | H06-177120 A | 6/1994 |
| JP | H09-102494 A | 4/1997 |
| JP | H09-219401 A | 8/1997 |
| JP | 10-98032 | 4/1998 |
| JP | H10-189467 A | 7/1998 |
| JP | H11-172439 | 6/1999 |
| JP | 2001-274404 | 10/2001 |
| JP | 2001-338922 A | 12/2001 |
| JP | 2002-009072 | 1/2002 |
| JP | 2002-134497 A | 5/2002 |
| JP | 2002-164345 A | 6/2002 |
| JP | 2002-539640 A | 11/2002 |
| JP | 2005-210076 A | 8/2005 |
| JP | 2005-310927 | 11/2005 |
| JP | 2006-060091 | 3/2006 |
| JP | 2006-303431 A | 11/2006 |
| JP | 2007-165883 | 6/2007 |
| JP | 2007-180362 A | 7/2007 |
| JP | 2007-189173 A | 7/2007 |
| JP | 2007-521658 A | 8/2007 |
| JP | 2007-287889 A | 11/2007 |
| JP | 2007-287890 A | 11/2007 |
| JP | 2008-500742 A | 1/2008 |
| JP | 2008-506262 A | 2/2008 |
| JP | 2008-060455 A | 3/2008 |
| JP | 2008-109093 A | 5/2008 |
| JP | 2008-517479 | 5/2008 |
| JP | 2008-522405 A | 6/2008 |
| JP | 2008-182199 A | 8/2008 |
| JP | 2008-258591 A | 10/2008 |
| JP | 2008-294260 A | 12/2008 |
| JP | 2008-306093 A | 12/2008 |
| JP | 2009-65203 A | 3/2009 |
| JP | 2009-170823 A | 7/2009 |
| JP | 2009-540128 A | 11/2009 |
| JP | 4364320 B2 | 11/2009 |
| JP | 2010-10497 A | 1/2010 |
| JP | 2010-043081 A | 2/2010 |
| JP | 2010-103484 A | 5/2010 |
| JP | 2010-118664 A | 5/2010 |
| JP | 2010-152136 | 7/2010 |
| JP | 2010-183069 A | 8/2010 |
| JP | 2010-530127 | 9/2010 |
| JP | 2010-245518 A | 10/2010 |
| JP | 2010-251654 A | 11/2010 |
| JP | 2010-283388 A | 12/2010 |
| JP | 2010-539730 A | 12/2010 |
| JP | 2011-023576 A | 2/2011 |
| JP | 2011-023655 A | 2/2011 |
| JP | 2011-054968 A | 3/2011 |
| JP | 11-067744 | 4/2011 |
| JP | 2011-187934 A | 9/2011 |
| JP | 2012-506640 A | 3/2012 |
| JP | 2012-199306 | 10/2012 |
| JP | 2013-102130 A | 5/2013 |
| JP | 2013-166965 A | 8/2013 |
| JP | 2013-196822 A | 9/2013 |
| JP | 2013-225655 A | 10/2013 |
| JP | 2013-240042 A | 11/2013 |
| JP | 2014-532304 A | 12/2014 |
| KR | 10-2001-0111448 | 12/2001 |
| KR | 10-0356473 B1 | 10/2002 |
| KR | 10-2004-0001036 | 1/2004 |
| KR | 10-2006-0056883 | 5/2006 |
| KR | 10-0721503 B1 | 5/2007 |
| KR | 10-2007-0060104 | 6/2007 |
| KR | 10-0734748 B | 7/2007 |
| KR | 10-2009-0057665 | 6/2009 |
| KR | 10-2009-0080019 | 7/2009 |
| KR | 10-2009-0081396 | 7/2009 |
| KR | 10-2009-0116433 | 11/2009 |
| KR | 10-2010-0133377 | 12/2010 |
| KR | 10-2011-0086090 | 7/2011 |
| KR | 10-2013-0056608 | 5/2013 |
| KR | 10-2015-0025224 | 3/2015 |
| TW | 483103 B | 4/2002 |
| TW | 200701341 | 1/2007 |
| TW | 2007/21306 | 6/2007 |
| TW | 201009942 A | 3/2010 |
| TW | 201042706 A1 | 12/2010 |
| TW | 2011/13934 A1 | 4/2011 |
| TW | 201140695 A1 | 11/2011 |

(56) References Cited

FOREIGN PATENT DOCUMENTS

| | | |
|---|---|---|
| TW | 201144475 A1 | 12/2011 |
| TW | 201621974 A | 6/2016 |
| WO | WO 2004/032196 | 4/2004 |
| WO | WO 2006/014471 | 2/2006 |
| WO | WO 2006/018441 | 2/2006 |
| WO | WO 2006/026350 | 3/2006 |
| WO | WO 2006/104741 | 10/2006 |
| WO | WO 2007/043709 | 4/2007 |
| WO | WO 2007/118026 | 10/2007 |
| WO | WO 2011/087580 | 7/2011 |
| WO | WO 2011/087850 | 7/2011 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/065806 | 5/2013 |
| WO | WO 2013/095396 | 6/2013 |
| WO | WO 2013/112727 | 8/2013 |

OTHER PUBLICATIONS

U.S. Final Office Action dated Sep. 13, 2013 issued in U.S. Appl. No. 13/084,399.
U.S. Notice of Allowance dated Jan. 15, 2014 issued in U.S. Appl. No. 13/084,399.
U.S. Office Action dated Jan. 2, 2015 issued in U.S. Appl. No. 14/231,554.
U.S. Final Office Action dated Jun. 10, 2015 issued in U.S. Appl. No. 14/231,554.
U.S. Notice of Allowance dated Aug. 31, 2015 issued in U.S. Appl. No. 14/231,554.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Apr. 13, 2011 issued in U.S. Appl. No. 12/889,132.
U.S. Notice of Allowance dated Sep. 30, 2011 issued in U.S. Appl. No. 12/889,132.
U.S. Office Action dated Aug. 1, 2012 issued in U.S. Appl. No. 13/011,569.
U.S. Final Office Action dated Feb. 26, 2013 issued in U.S. Appl. No. 13/011,569.
U.S. Notice of Allowance dated May 6, 2013 issued in U.S. Appl. No. 13/011,569.
U.S. Office Action dated Jul. 1, 2016 issued in U.S. Appl. No. 13/963,212.
U.S. Office Action dated Jan. 12, 2017 issued in U.S. Appl. No. 13/963,212.
U.S. Final Office Action dated Jun. 28, 2017 issued in U.S. Appl. No. 13/963,212.
U.S. Office Action dated Jan. 24, 2018 issued in U.S. Appl. No. 13/963,212.
U.S. Office Action dated Apr. 4, 2013 issued U.S. Appl. No. 13/242,084.
U.S. Notice of Allowance dated Jun. 19, 2013 issued U.S. Appl. No. 13/242,084.
U.S. Notice of Allowance dated Sep. 19, 2013 issued U.S. Appl. No. 13/242,084.
U.S. Office Action dated Sep. 21, 2015 issued U.S. Appl. No. 14/607,997.
U.S. Final Office Action dated Mar. 18, 2016 issued in U.S. Appl. No. 14/607,997.
U.S. Notice of Allowance dated Jun. 16, 2016 issued U.S. Appl. No. 14/607,997.
U.S. Notice of Allowance dated Sep. 27, 2016 issued U.S. Appl. No. 14/607,997.
U.S. Office Action dated Sep. 26, 2017 issued in U.S. Appl. No. 15/426,889.
U.S. Notice of Allowance dated Mar. 28, 2018 issued in U.S. Appl. No. 15/426,889.
U.S. Notice of Allowance dated Aug. 7, 2014 issued U.S. Appl. No. 14/133,239.
U.S. Notice of Allowance dated Nov. 26, 2014 issued U.S. Appl. No. 14/133,239.
U.S. Office Action dated Apr. 29, 2013 issued U.S. Appl. No. 13/224,240.
U.S. Final Office Action dated Nov. 22, 2013 issued U.S. Appl. No. 13/224,240.
U.S. Examiner's Answer to Appeal Brief (filed May 22, 2014) Before the Patent Trial and Appeal Board dated Aug. 14, 2014 issued U.S. Appl. No. 13/224,240.
U.S. Patent Board Decision on Appeal Before the Patent Trial and Appeal Board (Examiner Affirmed) dated Aug. 11, 2016 issued U.S. Appl. No. 13/224,240.
U.S. Notice of Allowance dated Nov. 17, 2016 issued U.S. Appl. No. 13/224,240.
U.S. Notice of Allowance (Supplemental Notice of Allowability) dated Feb. 21, 2017 issued U.S. Appl. No. 13/224,240.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated Apr. 11, 2014 issued in U.S. Appl. No. 14/065,334.
U.S. Office Action dated May 24, 2013 issued U.S. Appl. No. 13/472,282.
U.S. Notice of Allowance dated Oct. 4, 2013 issued U.S. Appl. No. 13/472,282.
U.S. Office Action dated May 21, 2014 issued U.S. Appl. No. 13/607,386.
U.S. Notice of Allowance dated Oct. 8, 2014 issued in U.S. Appl. No. 13/607,386.
U.S. Notice of Allowance dated Nov. 19, 2014 issued in U.S. Appl. No. 13/607,386.
U.S. Office Action dated Jun. 13, 2014 issued in U.S. Appl. No. 13/953,616.
U.S. Final Office Action dated Nov. 24, 2014 issued in U.S. Appl. No. 13/953,616.
U.S. Office Action dated Dec. 11, 2014 issued in U.S. Appl. No. 14/074,596.
U.S. Office Action dated Dec. 24, 2015 issued in U.S. Appl. No. 14/074,596.
U.S. Notice of Allowance dated Feb. 12, 2016 issued in U.S. Appl. No. 14/074,596.
U.S. Office Action dated May 15, 2015 issued in U.S. Appl. No. 14/074,617.
U.S. Notice of Allowance dated Nov. 20, 2015 issued in U.S. Appl. No. 14/074,617.
U.S. Office Action dated Dec. 30, 2016 issued in U.S. Appl. No. 15/015,952.
U.S. Notice of Allowance dated Jun. 15, 2017 issued in U.S. Appl. No. 15/015,952.
U.S. Notice of Allowance dated Jan. 29, 2018 issued in U.S. Appl. No. 15/650,662.
U.S. Office Action dated Aug. 14, 2015 issued in U.S. Appl. No. 14/061,587.
U.S. Notice of Allowance dated Feb. 11, 2016 issued in U.S. Appl. No. 14/061,587.
U.S. Notice of Allowance [Supplemental Notice of Allowability] dated Mar. 1, 2016 issued in U.S. Appl. No. 14/061,587.
U.S. Office Action dated Mar. 2, 2015 issued in U.S. Appl. No. 14/137,860.
U.S. Notice of Allowance dated Oct. 1, 2015 issued in U.S. Appl. No. 14/137,860.
U.S. Notice of Allowance [Supplemental Notice of Allowability] dated Oct. 22, 2015 issued in U.S. Appl. No. 14/137,860.
U.S. Office Action dated Feb. 3, 2017 issued in U.S. Appl. No. 14/987,542.

(56) References Cited

OTHER PUBLICATIONS

U.S. Notice of Allowance dated Jun. 20, 2017 issued in U.S. Appl. No. 14/987,542.
U.S. Notice of Allowance dated Aug. 22, 2017 issued in U.S. Appl. No. 14/987,542.
U.S. Office Action dated Nov. 9, 2018 issued in U.S. Appl. No. 15/654,186.
U.S. Notice of Allowance dated Mar. 7, 2019 issued in U.S. Appl. No. 15/654,186.
U.S. Office Action dated Jul. 10, 2014 issued in U.S. Appl. No. 14/144,107.
U.S. Final Office Action dated Jan. 15, 2015 issued in U.S. Appl. No. 14/144,107.
U.S. Notice of Allowance dated Mar. 19, 2015 issued in U.S. Appl. No. 14/144,107.
U.S. Office Action dated Oct. 21, 2015 issued in U.S. Appl. No. 14/194,549.
U.S. Final Office Action dated Nov. 1, 2016 issued in U.S. Appl. No. 14/194,549.
U.S. Office Action dated Apr. 19, 2017 issued in U.S. Appl. No. 14/194,549.
U.S. Final Office Action dated Sep. 20, 2017 issued in U.S. Appl. No. 14/194,549.
U.S. Notice of Allowance dated Feb. 14, 2018 issued in U.S. Appl. No. 14/194,549.
U.S. Office Action dated Mar. 21, 2019 issued in U.S. Appl. No. 15/976,793.
U.S. Notice of Allowance dated Aug. 5, 2015 issued in U.S. Appl. No. 14/183,287.
U.S. Office Action dated Aug. 1, 2016 issued in U.S. Appl. No. 14/932,869.
U.S. Office Action dated Jul. 2, 2015 issued in U.S. Appl. No. 14/187,145.
U.S. Final Office Action dated Dec. 16, 2015 issued in U.S. Appl. No. 14/187,145.
U.S. Notice of Allowance dated Feb. 25, 2016 issued in U.S. Appl. No. 14/187,145.
U.S. Office Action dated Jun. 9, 2017 issued in U.S. Appl. No. 15/224,347.
U.S. Notice of Allowance dated Oct. 4, 2017 issued in U.S. Appl. No. 15/224,347.
U.S. Notice of Allowance [Corrected Notice of Allowability] dated Nov. 28, 2017 issued in U.S. Appl. No. 15/224,347.
U.S. Office Action dated Jun. 14, 2016 issued in U.S. Appl. No. 15/019,904.
U.S. Notice of Allowance dated Oct. 13, 2016 issued in U.S. Appl. No. 15/019,904.
U.S. Office Action dated Nov. 25, 2016 issued in U.S. Appl. No. 15/178,474.
U.S. Notice of Allowance dated Feb. 10, 2017 issued in U.S. Appl. No. 15/178,474.
U.S. Notice of Allowance dated Mar. 27, 2017 issued in U.S. Appl. No. 15/178,474.
U.S. Notice of Allowance dated Apr. 18, 2017 issued in U.S. Appl. No. 15/178,474.
U.S. Office Action dated Aug. 22, 2017 issued in U.S. Appl. No. 15/609,864.
U.S. Final Office Action dated Dec. 4, 2017 issued in U.S. Appl. No. 15/609,864.
U.S. Notice of Allowance dated Mar. 9, 2018 issued in U.S. Appl. No. 15/609,864.
U.S. Office Action dated Apr. 13, 2015 issued in U.S. Appl. No. 14/335,785.
U.S. Final Office Action dated Aug. 24, 2016 issued in U.S. Appl. No. 14/335,785.
U.S. Notice of Allowance dated Nov. 4, 2016 issued in U.S. Appl. No. 14/335,785.
U.S. Notice of Allowance dated Feb. 22, 2017 issued in U.S. Appl. No. 14/335,785.
U.S. Notice of Allowance dated Mar. 21, 2017 issued in U.S. Appl. No. 14/335,785.
U.S. Notice of Allowance [Corrected Notice of Allowability] dated Apr. 19, 2017 issued in U.S. Appl. No. 14/335,785.
U.S. Office Action dated Oct. 1, 2015 issued in U.S. Appl. No. 14/552,245.
U.S. Office Action dated May 25, 2016 issued in U.S. Appl. No. 14/552,011.
U.S. Notice of Allowance dated Sep. 26, 2016 issued in U.S. Appl. No. 14/552,011.
U.S. Notice of Allowance dated Sep. 28, 2017 issued in U.S. Appl. No. 15/399,637.
U.S. Notice of Allowance dated Jul. 15, 2016 issued in U.S. Appl. No. 14/678,736.
U.S. Office Action dated Aug. 18, 2017 issued in U.S. Appl. No. 15/201,221.
U.S. Notice of Allowance dated Apr. 9, 2018 issued in U.S. Appl. No. 15/201,221.
U.S. Office Action dated Mar. 21, 2019 issued in U.S. Appl. No. 16/034,022.
U.S. Office Action dated Oct. 6, 2017 issued in U.S. Appl. No. 15/253,301.
U.S. Notice of Allowance dated Mar. 26, 2018 issued in U.S. Appl. No. 15/253,301.
U.S. Notice of Allowance dated Jun. 27, 2017 issued in U.S. Appl. No. 15/199,608.
U.S. Office Action dated Jan. 26, 2018 issued in U.S. Appl. No. 15/683,397.
U.S. Final Office Action dated Nov. 16, 2018 issued in U.S. Appl. No. 15/683,397.
U.S. Notice of Allowance dated Mar. 28, 2019 issued in U.S. Appl. No. 15/683,397.
U.S. Office Action dated Jul. 18, 2018 issued in U.S. Appl. No. 15/703,917.
U.S. Notice of Allowance dated Dec. 5, 2018 issued in U.S. Appl. No. 15/703,917.
Foreign Actions.
PCT International Search Report and Written Opinion, dated Oct. 20, 2011, issued in Application No. PCT/US2011/032186.
PCT International Preliminary Report on Patentability, dated Oct. 26, 2012, issued in Application No. PCT/US2011/032186.
Korean Office Action, dated Feb. 7, 2017, issued in Application No. KR 10-2012-7004925.
Korean Office Action, dated Aug. 23, 2017, issued in Application No. KR 10-2017-7020548.
Taiwan Office Action dated Apr. 27, 2016 issued in Application No. TW 100113041.
PCT Invitation to Pay Additional Fees; Communication Re Partial International Search, dated Dec. 16, 2011, issued in Application No. PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action dated Jun. 2, 2015 issued in Application No. CN 201180045808.6.
Chinese Second Office Action dated Feb. 2, 2016 issued in Application No. CN 201180045808.6.
Korean Office Action, dated May 23, 2017, issued in Application No. KR 10-2013-7010291.
Korean Office Action, dated Nov. 27, 2017, issued in Application No. KR 10-2013-7010291.
Korean Decision for Grant of Patent, dated Jul. 25, 2018, issued in Application No. KR 10-2013-7010291.
Taiwan Office Action dated May 5, 2016 issued in Application No. TW 100134208.
Taiwan Office Action dated Oct. 19, 2017 issued in Application No. TW 105130207.

(56) References Cited

OTHER PUBLICATIONS

PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
Chinese First Office Action dated Nov. 19, 2015 issued in Application No. CN 201280046487.6.
Chinese Second Office Action dated Aug. 22, 2016 issued in Application No. CN 201280046487.6.
Japanese Office Action dated Aug. 23, 2016 issued in Application No. JP 2014-531838.
Korean First Office Action dated Oct. 2, 2018 issued in Application No. KR 10-2014-7010949.
Singapore Supplementary Examination Report dated Jun. 1, 2016 issued in Application No. SG 11201400633R.
Taiwan Notice of Allowance and Search Report dated Dec. 18, 2015 issued in Application No. TW 101134692.
Taiwan First Office Action dated Mar. 14, 2018 issued in Application No. TW 106122777.
Taiwan Second Office Action dated Dec. 14, 2018 issued in Application No. TW 106122777.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
Chinese First Office Action dated Nov. 6, 2015 issued in Application No. CN 201280053888.4.
Chinese Second Office Action dated Aug. 16, 2016 issued in Application No. CN 201280053888.4.
Korean First Office Action dated Oct. 31, 2017 issued in Application No. KR 10-2014-7008696.
Korean Second Office Action dated Sep. 20, 2018 issued in Application No. KR 10-2014-7008696.
Korean Decision for Grant of Patent, dated May 17, 2019 issued in Application No. KR 10-2014-7008696.
Taiwan Office Action and Search Report dated Jan. 27, 2016 issued in Application No. TW 101131556.
Taiwan Office Action and Search Report dated Nov. 9, 2016 issued in Application No. TW 101131556.
Chinese First Office Action dated May 19, 2016 issued in Application No. CN 201310021460.8.
Chinese Second Office Action dated Apr. 13, 2017 issued in Application No. CN 201310021460.8.
Chinese Third Office Action dated Oct. 17, 2017 issued in Application No. CN 201310021460.8.
Chinese Fourth Office Action dated May 16, 2018 issued in Application No. CN 201310021460.8.
European Extended Search Report dated Apr. 14, 2014 issued in Application No. EP 13 15 2046.
European Examination Report dated Dec. 11, 2017 issued in Application No. EP 13 15 2046.
Japanese Office Action dated Jan. 10, 2017 issued in Application No. JP 2013-007612.
Japanese Decision of Rejection dated Jan. 9, 2018 issued in Application No. JP 2013-007612.
Japanese Reason for Refusal dated Apr. 2, 2019 issued in Application No. JP 2013-007612.
Japanese First Office Action dated May 29, 2019 issued in Application No. JP 2018-090402.
Korean Notice of Provisional Rejection dated Dec. 6, 2013 issued in Application No. KR 10-2012-0043797.
Korean Final Office Action dated Aug. 18, 2014 issued in Application No. KR 10-2012-0043797.
Korean Decision from the Patent Tribunal of the KIPO (description) dated May 26, 2015 issued in Application No. KR 10-2012-0043797.
Taiwan Examination Report dated Mar. 29, 2017 issued in Application No. TW 102102054.

PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Chinese First Office Action dated Feb. 22, 2016 issued in Application No. CN 201380006994.1.
Chinese Second Office Action dated Feb. 6, 2017 issued in Application No. CN 201380006994.1.
Japanese Notification of Reasons for Rejection dated Jan. 10, 2017 issued in Application No. JP2014-554825.
Japanese Decision of Refusal dated Dec. 5, 2017 issued in Application No. JP2014-554825.
Japanese Notice of Reason for Refusal dated Jul. 24, 2018 issued in Application No. JP 2017-159931.
Singapore Supplementary Examination Report dated Aug. 11, 2016 issued in Application No. SG 11201404315R.
Taiwan Office Action and Search Report dated Jul. 20, 2016 issued in Application No. TW 102102879.
Taiwan Office Action dated Oct. 25, 2016 issued in Application No. TW 102117772.
Taiwan Rejection Decision dated Aug. 17, 2017 issued in Application No. TW 102117772.
Japanese First Office Action dated Oct. 31, 2017 issued in Application No. JP 2013-230782.
Japanese Second Office Action dated May 22, 2018 issued in Application No. JP 2013-230782.
Japanese Decision to Grant dated Sep. 10, 2018 issued in Application No. JP 2013-230782.
Japanese Office Action dated Dec. 5, 2017 issued in Application No. JP 2013-231188.
Japanese Second Office Action [Decision of Rejection] dated Dec. 4, 2018 issued in Application No. JP 2013-231188.
Taiwan Examination Report dated Jul. 13, 2017 issued in Application No. TW 102140721.
Taiwan First Office Action dated Sep. 20, 2018 issued in Application No. TW 106140906.
Taiwan Examination Report dated Jan. 11, 2017 issued in Application No. TW 102138326.
Chinese First Office Action dated Nov. 28, 2016 issued in Application No. CN 201410521390.7.
Taiwan First Office Action dated May 3, 2018 issued in Application No. TW 103133765.
Japanese First Office Action dated Dec. 18, 2018 issued in Application No. JP 2014-262248.
Singapore Eligibility to Grant w/Supplemental Examination Report dated Apr. 23, 2019 issued in Application No. SG 10201408801Q.
Taiwan First Office Action dated Jun. 26, 2018 issued in Application No. TW 103145386.
Chinese First Office Action dated May 27, 2017 issued in Application No. CN 201510091775.9.
Chinese Second Office Action dated Mar. 26, 2018 issued in Application No. CN 201510091775.9.
Chinese Third Office Action dated Oct. 15, 2018 issued in Application No. CN 201510091775.9.
Chinese Fourth Office Action dated Mar. 27, 2019 issued in Application No. CN 201510091775.9.
Taiwanese First Office Action dated Sep. 14, 2018 issued in Application No. TW 104106165.
Chinese First Office Action dated Apr. 11, 2016 issued in Application No. CN 201510086588.1.
Chinese Second Office Action dated Mar. 20, 2017 issued in Application No. CN 201510086588.1.
Japanese Office Action dated Apr. 19, 2016 issued in Application No. JP 2015-21804.
Korean First Office Action dated Feb. 19, 2016, issued in Application No. KR 10-2015-0022610.
Korean Final Office Action dated Jun. 29, 2016, issued in Application No. KR 10-2015-0022610.
Taiwan Notice of Allowance and Search Report dated Aug. 30, 2018 issued in Application No. TW 104104471.
Singapore Search Report and Written Opinion dated Mar. 14, 2019 issued in Application No. SG 10201807090Q.

(56) References Cited

OTHER PUBLICATIONS

Taiwan First Office Action dated Sep. 13, 2018, issued in Application No. TW 104104648.
Chinese Third Office Action dated Dec. 22, 2017, issued in Application No. CN 201380006994.1.
Taiwanese First Office Action dated Nov. 9, 2018 issued in Application No. TW 104122669.
Chinese First Office Action dated Mar. 30, 2018 issued in Application No. CN 201610206201.6.
Chinese Second Office Action dated Jan. 24, 2019 issued in Application No. CN 201610206201.6.
Chinese First Office Action dated Oct. 8, 2018 issued in Application No. CN 201710522311.8.
PCT International Search Report and Written Opinion dated Feb. 25, 2019 issued in Application No. PCT/US2018/050049.
Cecchi et al., (2007) "Ultra-thin conformal pore-sealing of low-k materials by plasma-assisted ALD," *University of New Mexico, Albuquerque, NM, Sandia National Labs, Albuquerque, NM*, 1 page.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
Faraz et al., (2015) "Atomic Layer Etching. What Can We Learn from Atomic Layer Deposition?," *ECS Journal of Solid State Science and Technology*, 4(6):N5023-N5032.
Hausmann et al., (2002) "Atomic Layer Deposition of Hafnium and Zirconium Oxides Using Metal Amide Precursors," *Chem. Mater.* 14(10):4350-4358.
Elam et al., (2003) "Growth of ZnO/Al2O3 Alloy Films Using Atomic Layer Deposition Techniques," Chemistry of Materials, 2003, vol. 15, No. 4, pp. 1020-1028. <doi:10.1021/cm020607+>.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," *Journal of Non-Crystalline Solids*, 338-340:797-801.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$—Ar—$H_2$ plasma treatment for capacitor electrodes," *Materials Letters*, 59:615-617.
Li, Xingcun, et al., (2011) "Atomic Layer Deposition $Al_2O_3$ Thin Films in Magnetized Radio Frequency Plasma Source," *Physics Procedia* 18:100-106.
Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.
Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.
Plasma Enhanced Atomic Layer Deposition (PEALD), Website: http://www.asm.com/index.php?option=com_content&task=view&id=19&Itemid=161 (2010), 1 page.

"PlasmaPro™ NGP® 80 Range," *Oxford Instruments* (2010), 8 pages.
Pritchett, Merry, (May 2004) "Adherence/Diffusion Barrier Layers for Copper Metallization: Amorphous Carbon: Silicon Polymerized Films," Dissertation Prepared for the Degree of Doctor of Philosophy, *University of Texas*, 113pp.
Puurunen, Riikka L. (2005) "Surface chemistry of atomic layer deposition: A case study for the trimethylaluminum/water process," *Journal of Applied Physics*, 97:121301-1-121301-52.
van der Straten et al., (2004) "Atomic layer deposition of tantalum nitride for ultrathin liner applications in advanced copper metallization schemes," *Journal of Materials Research*, 19(2):447-453.
U.S. Appl. No. 16/036,784, filed Jul. 16, 2018, Ou et al.
U.S. Office Action dated Jul. 30, 2019 issued in U.S. Appl. No. 15/847,744.
Japanese Second Office Action dated Jun. 17, 2019 issued in Application No. JP 2017-159931.
Chinese Second Office Action dated Jun. 13, 2019 issued in Application No. CN 201710522311.8.
U.S. Appl. No. 16/428,067, filed May 31, 2019, Kang et al.
U.S. Appl. No. 16/556,122, filed Aug. 29, 2019, Arghavani et al.
U.S. Office Action dated Oct. 1, 2019 issued in U.S. Appl. No. 15/965,628.
U.S. Notice of Allowance dated Mar. 30, 2020 issued in U.S. Appl. No. 15/965,628.
U.S. Notice of Allowance dated Oct. 3, 2019 issued in U.S. Appl. No. 15/976,793.
U.S. Office Action dated Apr. 1, 2020 issued in U.S. Appl. No. 16/556,122.
U.S. Final Office Action dated Jan. 21, 2020 issued in U.S. Appl. No. 15/847,744.
U.S. Final Office Action dated Sep. 27, 2019 issued in U.S. Appl. No. 16/034,022.
Notice of Allowance dated Feb. 7, 2020 issued in U.S. Appl. No. 16/034,022.
Chinese First Office Action dated Jan. 20, 2020 issued in Application No. CN 201710347032.2.
Korean First Office Action dated Aug. 19, 2019 issued in Application No. KR 10-2019-7012231.
Japanese Third Office Action dated Mar. 10, 2020 issued in Application No. JP 2017-159931.
Japanese Second Office Action [Decision of Rejection] dated Jan. 14, 2020 issued in Application No. JP 2018-090402.
Korean First Office Action dated Jan. 15, 2020 issued in Application No. KR 10-2013-0135907.
Singapore Second Written Opinion dated Jan. 24, 2020 issued in Application No. SG 10201807090Q.
Taiwan First Office Action dated Oct. 16, 2019 issued in Application No. TW 105109955.
PCT International Preliminary Report on Patentability dated Mar. 26, 2020 issued in Application No. PCT/US2018/050049.
U.S. Final Office Action dated Sep. 25, 2020 issued in U.S. Appl. No. 16/556,122.
Chinese Reexamination Decision dated Sep. 11, 2020 issued in Application No. CN 201310021460.8.
Korean Decision for Grant of Patent dated Oct. 20, 2020 issued in Application No. KR 10-2013-0126834.
Korean Decision for Grant of Patent dated Sep. 7, 2020 issued in Application No. KR 10-2013-0135907.
Taiwanese First Office Action dated Dec. 21, 2020 issued in Application No. TW 106121191.
U.S. Office Action dated Dec. 7, 2020 issued in U.S. Appl. No. 16/428,067.
Chinese Third Office Action dated Jan. 6, 2021 issued in Application No. CN 201710347032.2.
Singapore Notice of Eligibility and Examination Report dated Nov. 6, 2020 issued in Application No. SG 10201807090Q.

\* cited by examiner

APPARATUS AND METHOD FOR DEPOSITION AND ETCH IN GAP FILL

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

The fabrication of integrated circuits includes many diverse processing steps. One of the operations frequently employed is the deposition of a dielectric film into a gap between features patterned over or into semiconductor wafers. One of the goals in depositing such material is to form a void-free, seam-free fill in the gap.

While deposition methods such as high density plasma (HDP), sub-atmospheric chemical vapor deposition (SACVD), and low pressure chemical vapor deposition (LPCVD) have been used for gap fill, these methods do not achieve the desired fill capability and conformality. Flowable chemical vapor deposition and spin-on dielectric (SOD) methods can achieve the desired fill, but tend to deposit highly porous films. Further, these methods are especially complex and costly to integrate, as they require many extra processing steps. Atomic layer deposition (ALD) processes have also been used for gap fill for improved conformality, but these processes suffer from long processing times and low throughput, especially for large gaps. Furthermore, the conformal nature of ALD processes means that the aspect ratios of the gaps increase with successive cycles. Hence, the top of a gap may fill more quickly than the bottom, preventing further diffusion of precursor materials into the gap. Areas can expand such that voids may form in the middle of high aspect ratio gaps.

In some cases, multi-step deposition processes are used, including deposition-etch-deposition processes which require distinct etching operations between subsequent deposition operations. The etching may be done to remedy or prevent void formation in the gap. Specifically, the etch step can be an anisotropic etch that creates a tapered positive slope profile so that gap fill can occur by depositing a subsequent layer on a positive tapered slope rather than a vertical slope. This can minimize the occurrence of void formation in the gap. Voids may lead to high resistance, contamination, loss of filled materials, and otherwise degrade performance of integrated circuits.

SUMMARY

This disclosure pertains to an integrated apparatus for performing deposition and etch processes. The integrated apparatus includes a process chamber, where the process chamber includes a showerhead and a pedestal. The integrated apparatus further includes a low-frequency radio-frequency (LFRF) generator, a high-frequency radio-frequency (HFRF) generator, and one or more switches operatively coupled to one or both of the LFRF generator and the HFRF generator. The one or more switches are configured to switch between (1) a deposition mode for performing a deposition process, where the one or more switches in the deposition mode couple at least the HFRF generator to the showerhead, and (2) an etch mode for performing an etch process, where the one or more switches in the etch mode couple the HFRF generator and the LFRF generator to the pedestal and ground the showerhead In some implementations, the process chamber is a capacitively-coupled plasma (CCP) reactor, and the showerhead includes a top electrode and the pedestal includes a bottom electrode. In some implementations, the one or more switches in the deposition mode couple the HFRF generator and the LFRF generator to the showerhead and ground the pedestal. In some implementations, the one or more switches include a first station relay switch configured to electrically connect the LFRF generator and the HFRF generator to the showerhead in the deposition mode, and a second station relay switch configured to electrically connect the LFRF generator and the HFRF generator to the pedestal in the etch mode. In some implementations, the first station relay switch is configured to switch to a first position to electrically connect the LFRF generator and the HFRF generator to the showerhead and switch to a second position to ground the showerhead, and the second station relay switch is configured to switch to a first position to electrically connect the LFRF generator and the HFRF generator to the pedestal and switch to a second position to ground the pedestal, where the first position of the first station relay switch is synchronized with the second position of the second station relay switch, and the first position of the second station relay switch is synchronized with the second position of the first station relay switch. In some implementations, the LFRF generator is part of a first integrated circuit board and the HFRF generator is part of a second integrated circuit board. In some implementations, the one or more switches include a switch operatively coupled to the HFRF generator and configured to switch between delivering power from the HFRF generator to the showerhead in the deposition mode and delivering power from the HFRF generator to the pedestal in the etch mode.

This disclosure also pertains to an integrated apparatus for performing deposition and etch processes. The integrated apparatus includes a process chamber, where the process chamber includes a showerhead and a pedestal. The integrated apparatus further includes an integrated circuit board, where the integrated circuit board includes one or more HF/LF RF generators. The integrated apparatus further includes one or more switches operatively coupled to the one or more HF/LF RF generators, the one or more switches configured to switch between (1) a deposition mode for performing a deposition process, wherein the one or more switches in the deposition mode couple at least one of the HF/LF RF generators to the showerhead, and (2) an etch mode for performing an etch process, wherein the one or more switches in the etch mode couple at least one of the HF/LF RF generators to the pedestal.

In some implementations, the process chamber is a CCP reactor, and wherein the showerhead includes a top electrode and the pedestal includes a bottom electrode. In some implementations, the integrated circuit board includes a single HF/LF RF generator. In some implementations, the one or more switches include a first station relay switch configured to electrically connect one of the HF/LF RF generators to the showerhead in the deposition mode, and a second station relay switch configured to electrically connect one of the HF/LF RF generators to the pedestal in the etch mode. In some implementations, the first station relay switch is configured to switch to a first position to electrically connect one of the HF/LF RF generators to the showerhead in the deposition mode and switch to a second position to ground the showerhead, and the second station relay switch is configured to switch to a first position to electrically connect one of the HF/LF RF generators to the pedestal in the etch mode and switch to a second position to ground the pedestal, where the first position of the first station relay switch is synchronized with the second position of the second station relay switch, and the first position of the second station relay switch is synchronized with the second position of the first station relay switch. In some implementations, the one or more switches further include a pedestal grounding relay switch to ground the pedestal in the deposition mode when one of the HF/LF RF generators are operatively coupled to the showerhead, and a showerhead grounding relay switch to ground the showerhead in the etch mode when one of the HF/LF RF generators are operatively coupled to the pedestal.

This disclosure also pertains to a method of filling one or more gaps in a wafer. The method includes providing a wafer on a pedestal in a plasma processing chamber, where the wafer has one or more gaps each having a depth to width aspect ratio of greater than about 5:1, depositing, in the plasma processing chamber, a first dielectric layer in the one or more gaps via ALD, anisotropically etching with slope control, in the plasma processing chamber, the first dielectric layer, and depositing, in the plasma processing chamber, a second dielectric layer in the one or more gaps over the first dielectric layer via ALD.

In some implementations, a wafer temperature is between about 80° C. and about 400° C. while depositing the first dielectric layer, while anisotropically etching with slope control the first dielectric layer, and while depositing the second dielectric layer. In some implementations, a pressure is between about 0.3 and about 1.0 Torr while depositing the first dielectric layer, while anisotropically etching with slope control the first dielectric layer, and while depositing the second dielectric layer. In some implementations, the method further includes switching to apply a low-frequency power and a high-frequency power to the pedestal in the plasma processing chamber and to ground a showerhead in the plasma processing chamber prior to anisotropically etching with slope control the first dielectric layer, and switching to apply the high-frequency power to the showerhead in the plasma processing chamber and to ground the pedestal in the plasma processing chamber prior to depositing the second dielectric layer.

These and other embodiments are described further below with reference to the figures.

BRIEF DESCRIPTION OF THE DRAWINGS

FIGS. 1A-1C depict example cross-sections of a wafer with a gap at various phases of a deposition-etch-deposition gap fill process.

DETAILED DESCRIPTION

Introduction

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

As circuit densities increase in the semiconductor industry, the width of gaps or trenches in a wafer decrease, thereby increasing their aspect ratios and making it progressively more difficult to fill the gaps or trenches without leaving voids. The formation of voids when the gap is not filled completely can have adverse effects on the operation of a completed device.

Deposition-etch-deposition sequences are employed to remedy or eliminate the presence of voids in gap fill. Common deposition techniques that are used in deposition-etch-deposition sequences are ALD, CVD, plasma-enhanced CVD, and HDP-CVD. A deposition step may be followed by an etch step, such as a sputter etch in HDP applications or reactive ion etch (ME) in ALD applications. The etch step may be an anisotropic etch step that creates a tapered positive slope profile. As a result, more material may be removed near the opening of the gap than from inside the gap.

Figure 1C:
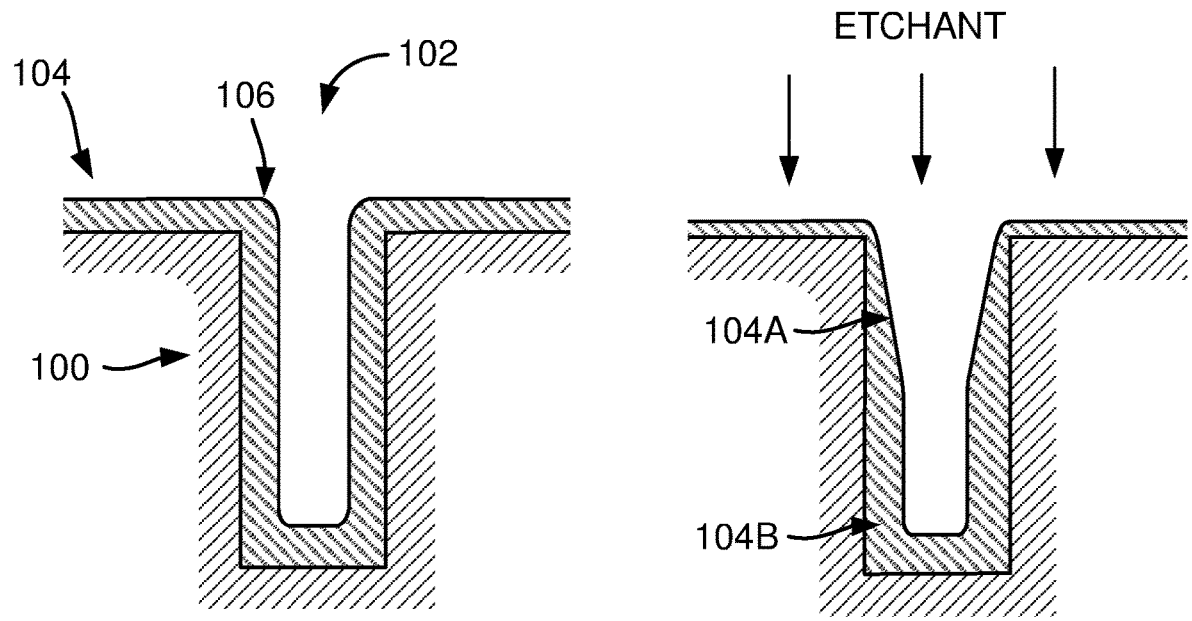
Figure 1C:
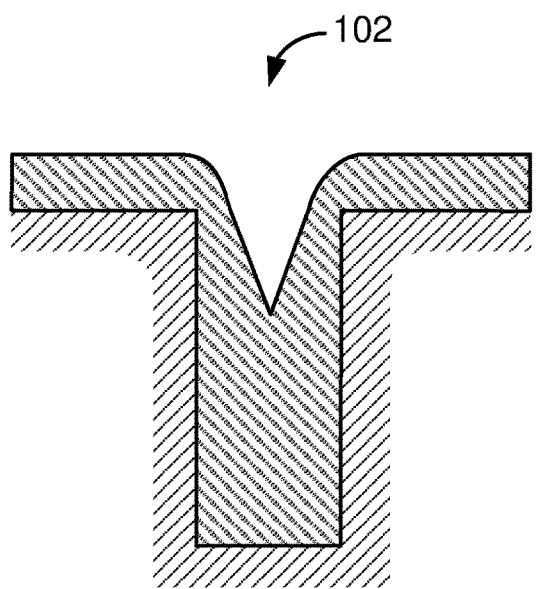

FIGS. 1A-1C depict example cross-sections of a wafer with a gap at various phases of a deposition-etch-deposition gap fill process. FIG. 1A shows a cross-section of a non-planar wafer 100 including a gap 102. The gap width can vary according to various embodiments, which may range from about 5 Å to about 50 µm. Depth to width aspect ratios can be greater than about 2:1, or greater than about 5:1, or greater than about 10:1, or even greater than about 30:1. The gap 102 can be covered with a thin film 104 using any suitable deposition technique, such as ALD, CVD, plasma-enhanced CVD, and HDP-CVD. In some embodiments, the thin film 104 can be conformal or nearly conformal with the gap 102. As shown in FIG. 1A, the thin film 104 includes a re-entrant portion 106 near the top of the gap 102.

In FIG. 1B, an anisotropic etch is applied to the thin film 104. The re-entrant portion 106 of the thin film 104 can be selectively removed by the anisotropic etch so that an upper region 104a of the thin film 104 is thinner than a lower region 104b. For example, an anisotropic etch may be achieved by imposing mass transfer limitations and/or lifetime limitations on the active etch species. In some implementations, selective etching at the top of the gap 102 may also adjust a sidewall angle of the gap 102, so that the gap 102 is wider at the top than at the bottom. This may further reduce bread loafing effects in subsequent deposition phases.

In FIG. 1C, a subsequent deposition step is applied to fill or nearly fill the gap 102. In some implementations, the gap 102 may be filled after multiple deposition-etch-deposition sequences. The gap 102 may be free of voids. The gap 102 can be filled using any suitable deposition technique, such as ALD, CVD, plasma-enhanced CVD, HDP-CVD, etc.

Common gap fill processes may employ HDP-CVD systems. HDP-CVD systems form a plasma that can be at least approximately two orders of magnitude greater than the density of a standard CCP-CVD systems. HDP-CVD systems are typically inductively-coupled plasma (ICP) systems. An example HDP-CVD system with an ICP reactor to accomplish deposition and etch is the Speed™ system available from Lam Research Corporation of Fremont, Calif. Some HDP-CVD techniques promote sputtering by the high density of the plasma, which can occur simultaneous with film deposition. As a result, deposition and etch can be said to occur simultaneously, as the sputtering component of HDP deposition processes slows deposition of certain features, such as corners or raised surfaces, thereby contributing to improved gap fill. However, the sputtering in such HDP-CVD techniques may lead to undesirable redeposition of material on sidewalls of the gap. Some HDP-CVD techniques may employ separate deposition and etch steps. During the etch step, material may be non-conformally removed by an anisotropic sputter etch. Material in the corners may be removed over short distances along the sidewalls of the gap. However, such an anisotropic sputter etch can result in redeposition cusps that can hinder gap filling. Even though HDP-CVD techniques may perform gap fill processes in a single chamber or apparatus, the deposited film from HDP-CVD techniques is not conformal and may actually limit the application of deposition-etch-deposition sequences to be performed in a single chamber or apparatus.

Given the limitations of HDP-CVD techniques in performing gap fill, ALD processes may be used to provide improved conformality. In contrast to CVD processes, ALD processes use surface-mediated deposition reactions to deposit films on a layer-by-layer basis. In some implementations, ALD processes may be performed in a CCP system, such as in a CCP system illustrated in FIG. 2. The CCP system may be capable of supplying high-frequency RF power to generate a plasma. An example of such a CCP system is the Vector™ system available from Lam Research Corporation of Fremont, Calif.

Figure 2:
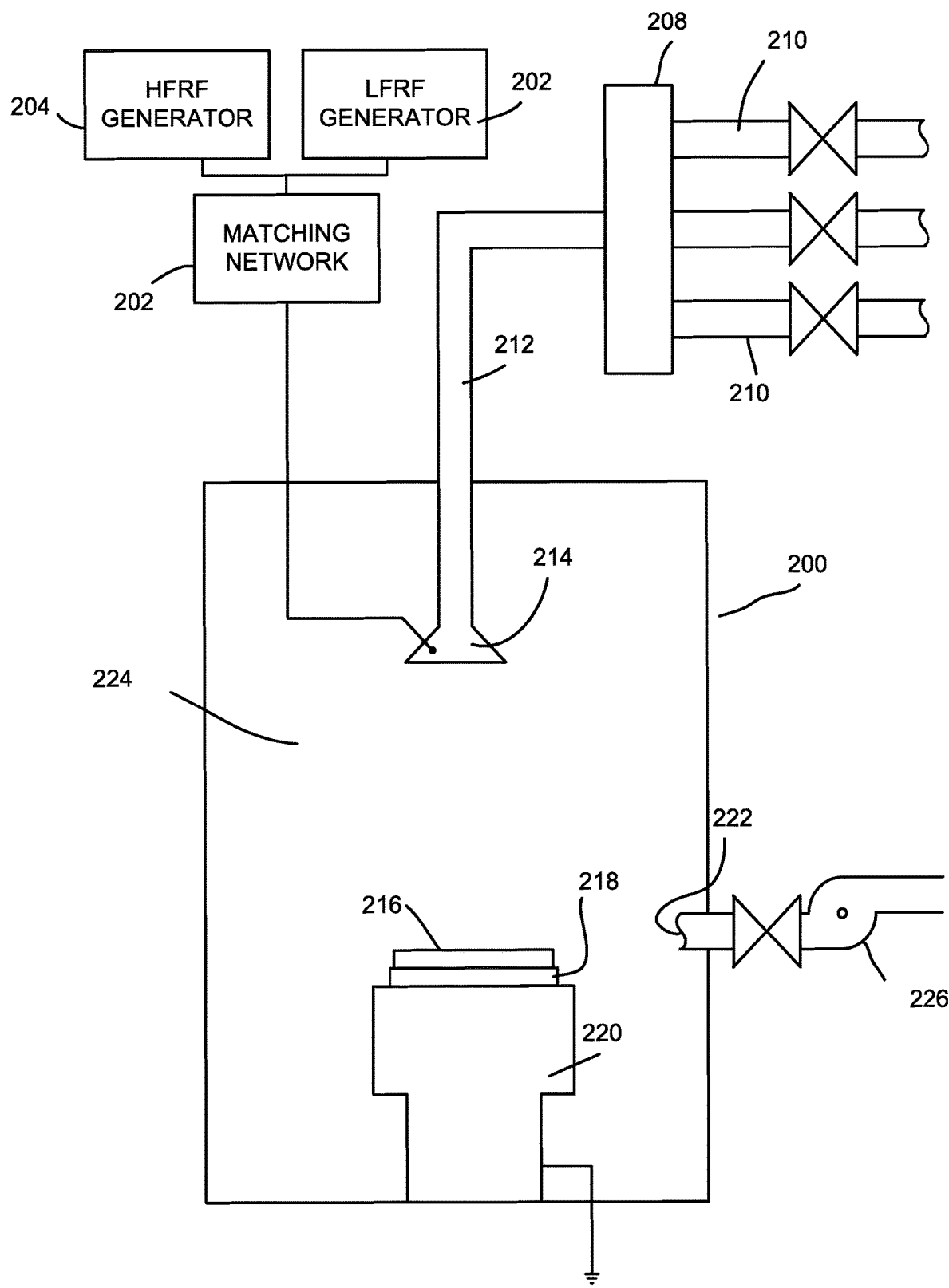
FIG. 2 shows a schematic illustration of an example apparatus for carrying out deposition processes in a conventional deposition-etch-deposition gap fill process.

FIG. 2 shows a schematic illustration of an example apparatus for carrying out deposition processes in a conventional deposition-etch-deposition gap fill process. As shown in FIG. 2, an apparatus 200 includes a process chamber 224, which encloses other components of the apparatus 200 and serves to contain the plasma. The process chamber 224 includes a showerhead 214 for delivering process gases into the process chamber 224. A high-frequency radio-frequency (HFRF) generator 204 may be connected to an impedance matching network 206, which is connected to the showerhead 214. In some implementations, a low-frequency radio-frequency (LFRF) generator 202 may be connected to the impedance matching network 206 to connect to the showerhead 214. The power and frequency supplied by the impedance matching network 306 is sufficient to generate a plasma from the process gas. In typical processes, a frequency generated by the HFRF generator 204 is between about 2-60 MHz, such as 13.56 MHz or 27 MHz. A frequency generated by the LFRF generator 202 is between about 250-400 kHz, such as 350 kHz or 400 kHz.

The process chamber 224 further includes a wafer support or pedestal 218. The pedestal 218 can support a wafer 216. The pedestal 218 can include a chuck, a fork, and/or lift pins to hold the wafer 216 during and between processing. In some implementations, the chuck may be an electrostatic chuck.

Process gases are introduced via inlet 212. One or more source gas lines 210 can be connected to a manifold 208. The process gases may be premixed or not. Appropriate valving and mass flow control mechanisms are employed to ensure that the correct gases are delivered during deposition, etch, and other plasma treatment operations. Process gases may exit the process chamber 224 via an outlet 222. A vacuum pump 226 can typically draw process gases out and maintain a suitably low pressure within the process chamber 224.

As shown in FIG. 2, the apparatus 200 is a capacitor type system where the showerhead 214 is an electrode working in conjunction a grounded block 220. In other words, the apparatus 200 is a CCP system and may be capable of supplying high-frequency RF power to the top of the process chamber 224, namely the showerhead 214. The bottom of the process chamber 224, namely the pedestal 218 and the block 220, is grounded.

Figure 3:
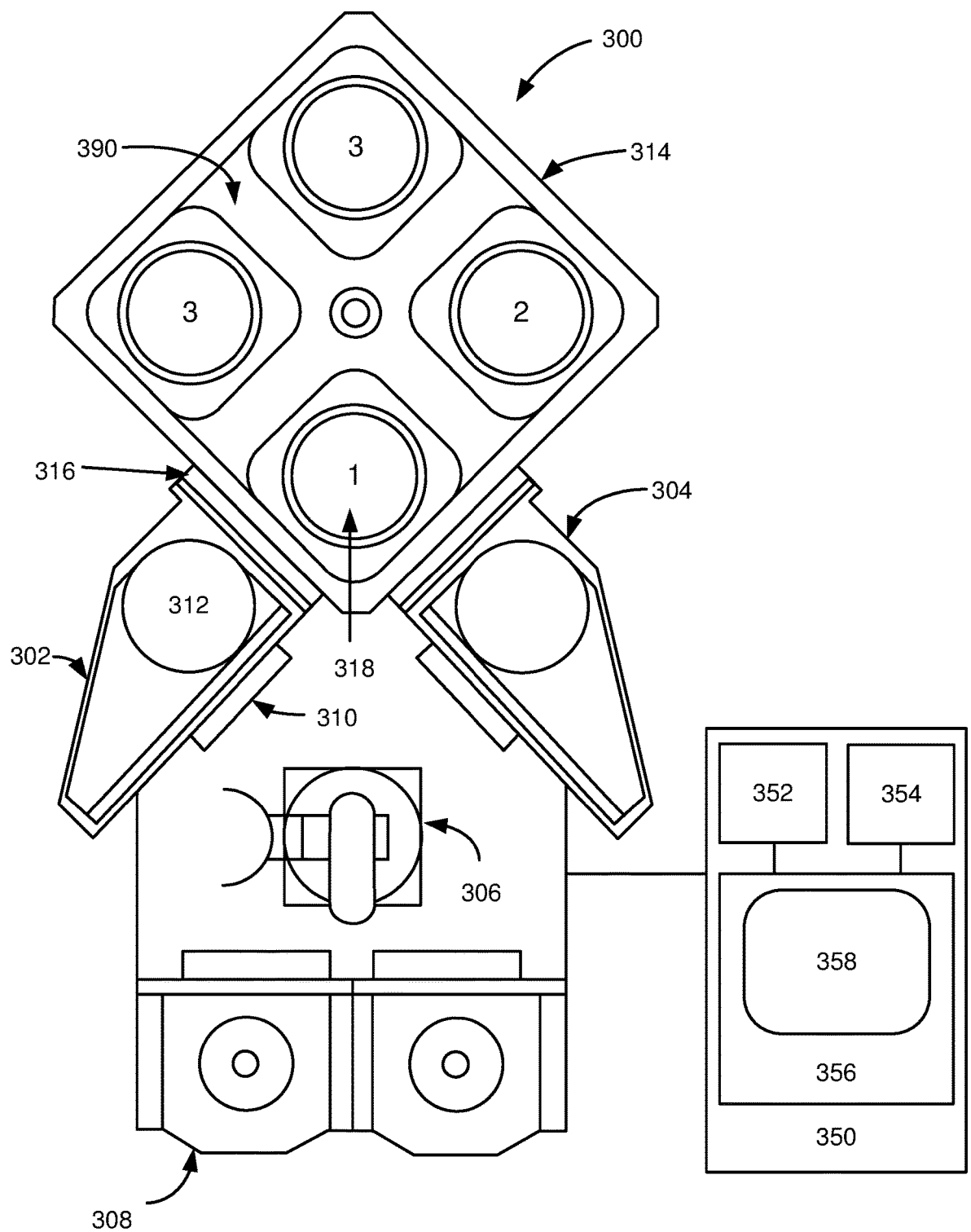
FIG. 3 shows a schematic illustration of an example multi-station processing tool.

One or more apparatuses for performing deposition-etch-deposition sequences, such as the apparatus 200, may be implemented in a multi-station processing tool. FIG. 3 shows a schematic illustration of an example multi-station processing tool. The multi-station processing tool 300 may include an inbound load lock 302 and an outbound load lock 304, either or both of which may comprise a plasma source. A robot 306, at atmospheric pressure, is configured to move wafers from a cassette loaded through a pod 308 into the inbound load lock 302 via an atmospheric port 310. A wafer is placed by the robot 306 on a pedestal 312 in the inbound load lock 302, the atmospheric port 310 is closed, and the load lock 302 is pumped down. Where the inbound load lock 302 comprises a plasma source, the wafer may be exposed to a plasma treatment in the load lock 312 prior to being introduced to a process chamber 314. Further, the wafer may be heated in the inbound load lock 302 as well, for example, to remove moisture and adsorbed gases. Next a chamber transport port 316 to the process chamber 314 is opened, and another robot (not shown) places the wafer into the reactor on a pedestal of a first station shown in the reactor for processing. While the embodiment depicted in FIG. 3 includes load locks, it will be appreciated that, in some embodiments, direct entry of a wafer into a process station may be provided.

The depicted process chamber 314 includes four process stations, numbered 1 to 4 in the embodiment shown in FIG. 3. Each station can have a heated pedestal (shown at 318 for station 1), and gas line inlets. It will be appreciated that in some embodiments, each process station may have different or multiple purposes. For example, in some embodiments, a process station may be switchable between an ALD and PECVD mode. As discussed later according to the present disclosure, in some embodiments, a process station may include a CCP reactor that is switchable between a deposition mode and an etch mode. While the depicted process chamber 314 comprises four stations, it will be understood that a process chamber 314 according to the present disclosure may have any suitable number of stations. For example, in some embodiments, a process chamber 314 may have five or more stations, while in other embodiments a process chamber 314 may have three or fewer stations.

FIG. 3 also depicts a wafer handling system 390 for transferring wafers within the process chamber 314. In some embodiments, wafer handling system 390 may transfer wafers between various process stations and/or between a process station and a load lock. It will be appreciated that any suitable wafer handling systems may be employed. Non-limiting examples include wafer carousels and wafer handling robots. FIG. 3 also depicts a system controller 350 employed to control process conditions and hardware states of the multi-station processing tool 300. System controller 350 may include one or more memory devices 356, one or more mass storage devices 354, and one or more processors 352. Processor 352 may include a CPU or computer, analog and/or digital input/output connections, stepper motor controller boards, etc.

In some embodiments, system controller 350 controls all of the activities of the multi-station process tool 300. System controller 350 executes system control software 358 stored in mass storage device 354, loaded into memory device 356, and executed on processor 352. System control software 358 may include instructions for controlling the timing, mixture of gases, chamber and/or station pressure, chamber and/or station temperature, purge conditions and timing, wafer temperature, RF power levels, RF frequencies, wafer and/or pedestal position, deposition and etch mode switching, and other parameters of a particular process performed by multi-station process tool 300. System control software 358 may be configured in any suitable way. For example, various process tool component subroutines or control objects may be written to control operation of the process tool components necessary to carry out various process tool processes in accordance with the disclosed methods. System control software 358 may be coded in any suitable computer readable programming language.

In some embodiments, system control software 358 may include input/output control (IOC) sequencing instructions for controlling the various parameters. For example, each phase of an ALD process may include one or more instructions for execution by system controller 350. In addition, switching from a deposition mode to an etch mode may include one or more instructions for execution by the system controller 350. The instructions for setting process conditions for an ALD process may be included in a corresponding ALD recipe phase, and the instructions for setting process conditions for an anisotropic etch process may be included in a corresponding etch recipe phase. In some implementations, the ALD and etch recipe phases may be sequentially arranged.

Other computer software and/or programs stored on mass storage device 354 and/or memory device 356 associated with system controller 350 may be employed in some embodiments. Examples of programs or sections of programs for this purpose include a wafer positioning program, a process gas control program, a pressure control program, a heater control program, and a plasma control program.

A wafer positioning program may include program code for process tool components that are used to load the wafer onto pedestal 318 and to control the spacing between the wafer and other parts of process tool 300.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the wafer. Alternatively, the heater control program may control delivery of a heat transfer gas (such as helium) to the wafer.

A plasma control program may include code for setting RF power levels applied to the process electrodes in one or more process stations.

In some embodiments, there may be a user interface associated with system controller 350. The user interface may include a display screen, graphical software displays of the apparatus and/or process conditions, and user input devices such as pointing devices, keyboards, touch screens, microphones, etc.

In some embodiments, parameters adjusted by system controller 350 may relate to process conditions. Non-limiting examples include process gas composition and flow rates, deposition and etch mode, wafer temperature, pressure, plasma conditions (such as RF power levels), etc. These parameters may be provided to the user in the form of a recipe, which may be entered utilizing the user interface.

Signals for monitoring the process may be provided by analog and/or digital input connections of system controller 350 from various process tool sensors. The signals for controlling the process may be output on the analog and digital output connections of the multi-station process tool 300. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 350 may provide program instructions for implementing the disclosed processes, including the deposition-etch-deposition gap fill processes. The program instructions may control a variety of process parameters, such as DC power level, RF power level, RF bias power level, pressure, wafer temperature, etc. The instructions may control the parameters to operate deposition-etch-deposition sequences according to various embodiments described herein.

Deposition and Etch Modes

Figure 4A:
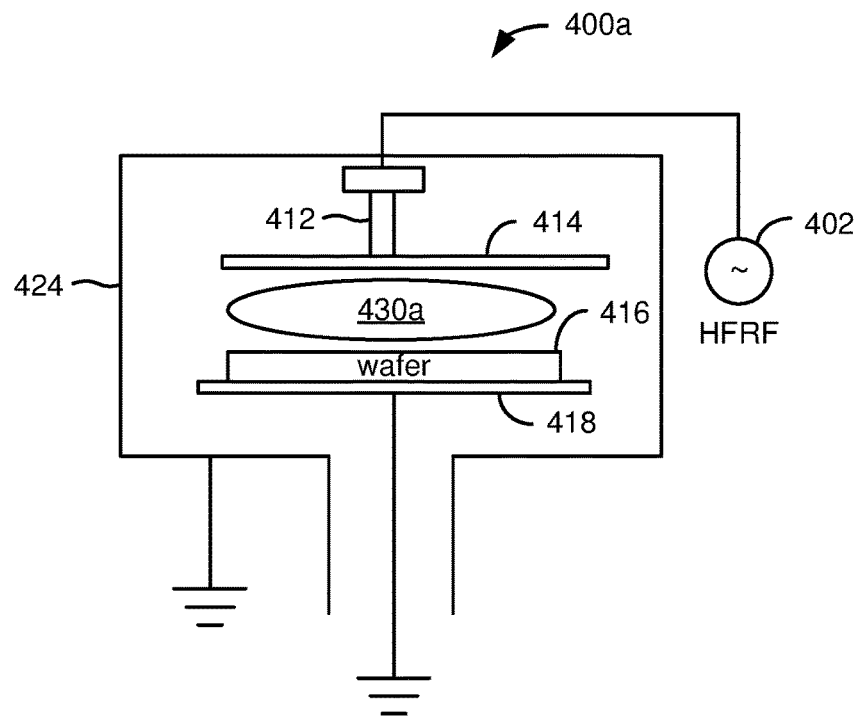
FIG. 4A shows a schematic illustration of an example apparatus including a capacitively-coupled plasma (CCP) reactor for carrying out deposition processes.
Figure 4B:
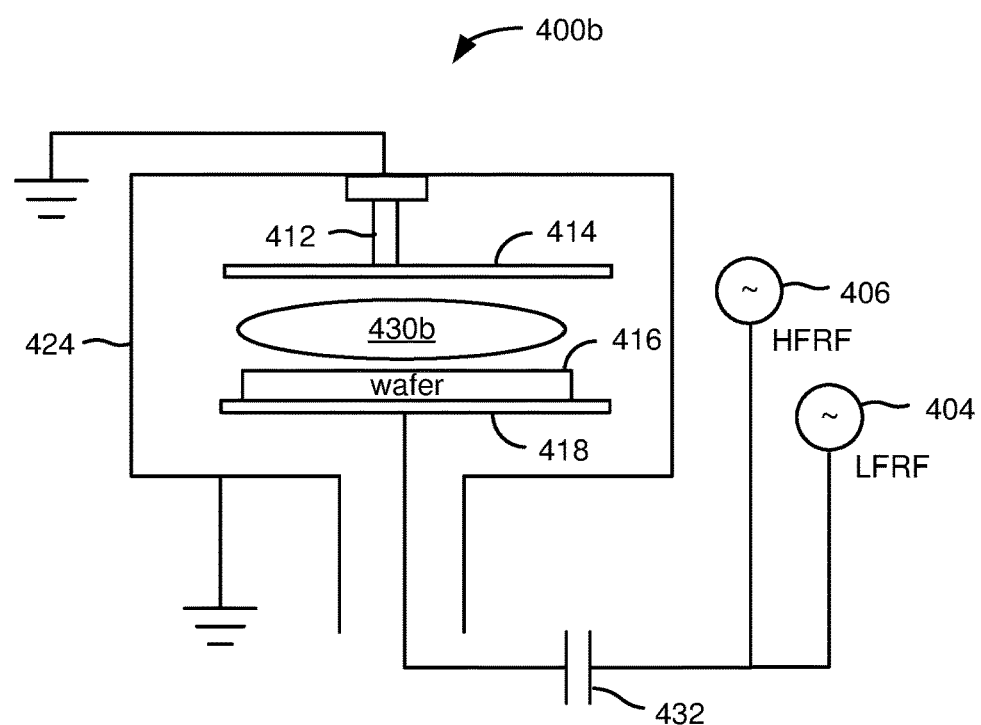
FIG. 4B shows a schematic illustration of an example apparatus including a CCP reactor for carrying out etch processes.

Typically, deposition in a CCP reactor may occur in certain hardware configurations, and etch in a CCP reactor may occur in different hardware configurations. Specifically, ALD in a CCP reactor may be optimized according to certain RF hardware configurations, and etch in a CCP reactor may be optimized according to different RF hardware configurations. FIGS. 4A and 4B show different RF hardware configurations for performing deposition and etch in a CCP reactor. In FIG. 4A, the wafer is supported on a grounded electrode for deposition and the top electrode is powered. In FIG. 4B, the wafer is supported on a powered electrode for etch and the top electrode is grounded.

FIG. 4A shows a schematic illustration of an example apparatus including a CCP reactor for carrying out deposition processes. An apparatus 400a includes a CCP reactor 424 capable of performing PECVD or ALD. The CCP reactor 424 includes a showerhead 414 that serves as a top electrode and a pedestal 418 that serves as a bottom electrode. The pedestal 418 is below and opposite the showerhead 414 and may support a wafer 416 to be processed. In some implementations, the wafer 416 may have one or more features so that the wafer 416 is not planar. For example, the wafer 416 may have one or more gaps or a plurality of gaps. In some embodiments, the pedestal 418 may be raised or lowered. Process gases are introduced to the showerhead 414 via gas inlet 412, and the showerhead 414 distributes the process gases into the CCP reactor 424 and towards the wafer 416. An RF power supply 402 may be electrically connected to the showerhead 414 for generating a plasma 430a in a volume between the showerhead 414 and the wafer 416. The plasma 430a in the hardware configuration of FIG. 4A can be optimized for deposition. In some embodiments, the plasma energy can be controlled by controlling one or more of chamber pressure, gas concentration, gas mixture, RF source power, RF source frequency, duty cycle, pulse frequency, etc.

FIG. 4A illustrates an example RF hardware configuration for deposition, where the RF power supply 402 can be an HFRF generator electrically connected to the showerhead 414 and where the pedestal 418 is grounded. The RF hardware configuration of FIG. 4A is generally not capable of providing sufficient etch rates because an insufficient voltage drop across the wafer 416 would be produced. However, the RF hardware configuration of FIG. 4A is capable of fast frequency tuning, which can be important in ALD applications.

Fast frequency tuning is what allows for impedance matching to occur quickly in the RF hardware configuration of FIG. 4A. Impedance matching is the practice of designing the input impedance of an electrical load or the output impedance of its corresponding signal source in order to maximize the power transfer and minimize reflection from the load. In a plasma processing context, impedance matching is used to minimize the reflected power back from a plasma discharge into the transmission line (e.g., RF cables), and maximize the power transferred from an RF power supply 402 into the plasma discharge. In addition, if the RF power supply 402 is not matched, there is reflected power that builds standing waves on a transmission line between the source (RF power supply 402) and the load (plasma 430a), which can lead to further power waste and cause frequency-dependent loss. In some implementations, an impedance matching network (not shown) can be coupled to the RF power supply 402. The impedance matching network can transform the load impedance presented from the plasma 430a to match the source impedance of the RF power supply 402. Typically, the impedance matching network can be equipped with one or more capacitors or inductors to tune the impedance of the RF power supply 402 to match the plasma impedance. However, tuning the impedance using capacitors or inductors can be a long process, which can be undesirable in applications that require short plasma on-times. For example, to operate in an ALD window, processes can take on the order of 0.5 seconds or less. So rather than matching impedance using capacitors or inductors, impedance matching can occur by simply switching the frequency of the RF power supply 402. To illustrate, if the impedance of the RF power supply 402 needs to match the plasma impedance at 50 ohms, then the RF power supply 402 can quickly switch from operating at 13.56 MHz to 13.8 MHz. This kind of fast frequency tuning may not be possible in other RF hardware configurations, such as what is illustrated in FIG. 4B.

FIG. 4B shows a schematic illustration of an example apparatus including a CCP reactor for carrying out etch processes. The apparatus 400b includes a CCP reactor 424 capable of performing plasma etching. Like the apparatus 400a in FIG. 4A, the apparatus 400b in FIG. 4B includes a showerhead 414, a pedestal 418, a wafer 416, and a gas inlet 412. An RF power supply 404, 406 may be electrically connected to the pedestal 418 for applying a voltage drop across the wafer 416. The RF power supply 404, 406 may include both an LFRF generator 404 and an HFRF generator 406. A plasma 430b may be generated in a volume between the showerhead 414 and the wafer 416. The plasma 430b in the hardware configuration of FIG. 4B may be optimized for etching.

FIG. 4B illustrates an example RF hardware configuration for etching, where the LFRF generator 404 and the HFRF generator 406 can be electrically connected to the pedestal 418 and where the showerhead 414 is grounded. In some implementations, the LFRF generator 404 can provide a low-frequency RF signal between about 2 Hz and about 1000 kHz, such as 400 kHz. In some implementations, the HFRF generator 406 can provide a high-frequency RF signal between about 1 MHz and about 100 MHz, such as 13.56 MHz. A blocking capacitor 432 can be positioned between the pedestal 418 and both the LFRF generator 404 and the HFRF generator 406. With both high-frequency and low-frequency signals being mixed, the blocking capacitor 432 can serve as a filter leading to the pedestal 418. The RF configuration of FIG. 4B is not capable of fast frequency tuning. This is due in part to the number of components in the RF path that would prevent the fast response necessary for frequency tuning. Accordingly, ALD processes would generally not be able to operate in such conditions where the pedestal 418 is biased in FIG. 4B. However, unlike the RF configuration of FIG. 4A, the RF configuration of FIG. 4B is able to provide a high voltage drop across the wafer 416.

Deposition-Etch-Deposition Integrated Apparatus

Rather than performing deposition and etch in an RF hardware configuration that is optimal for one process but not the other, and rather than constantly transferring a wafer from one apparatus to another for implementing deposition-etch-deposition sequences, the present disclosure provides for an integrated apparatus that is optimal for both deposition and etch, and that integrates deposition-etch-deposition sequences in a single apparatus. An integrated apparatus can provide an RF hardware configuration that is optimal for both deposition and etch modes using a combination of different hardware components, such as relay switches, DO bit switches, integrated circuit boards (e.g., splitter boards), RF generators, coaxial cables, switchboxes, RF filters, match units, etc.

Figure 5A:
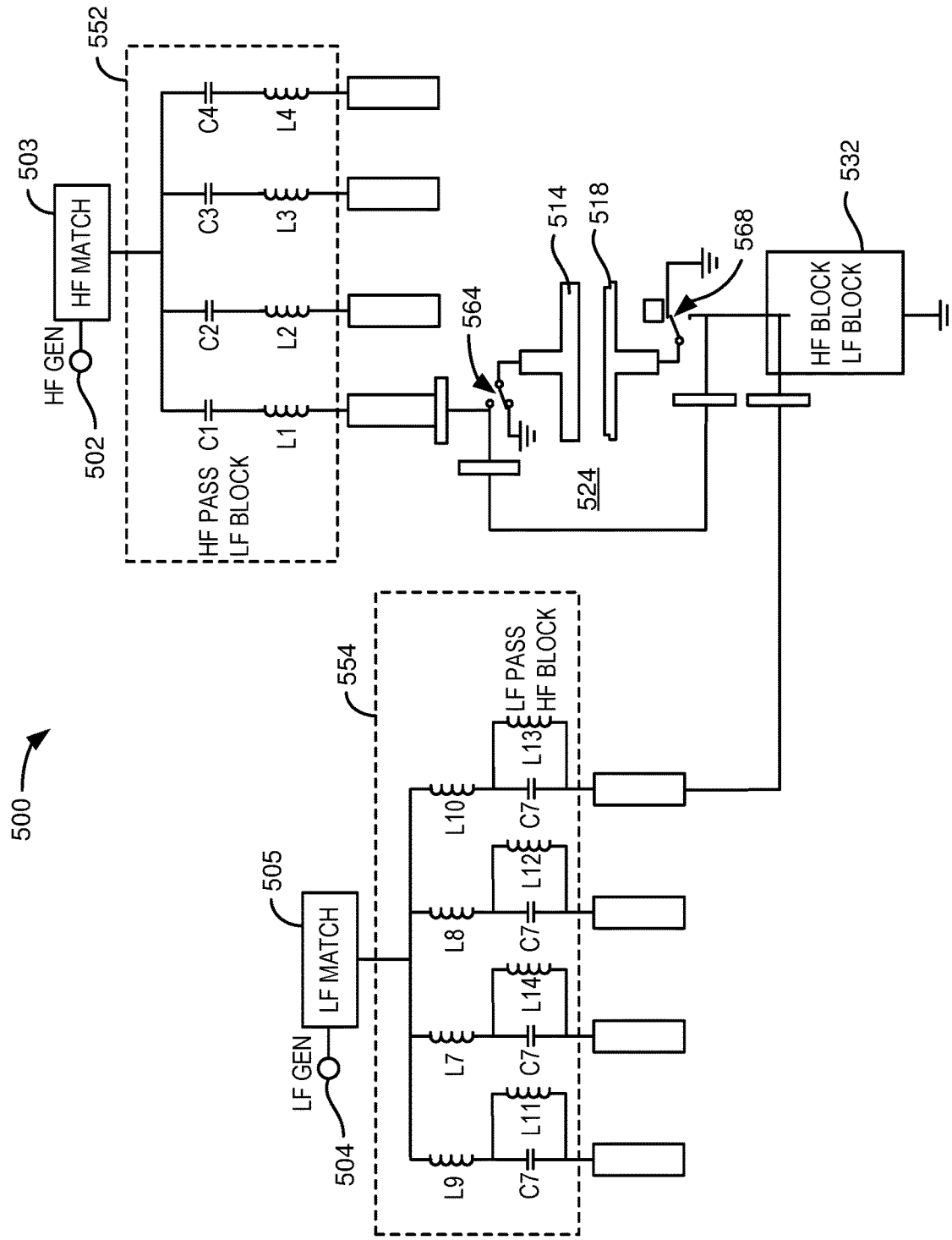
FIGS. 5A and 5B each shows a schematic illustration of an example integrated apparatus including a plasma processing chamber configured to switch between a deposition mode and an etch mode according to some implementations.

FIG. 5A shows a schematic illustration of an example integrated apparatus including a plasma processing chamber configured to switch between a deposition mode and an etch mode according to some implementations. The integrated apparatus 500 includes a plasma processing chamber 524, where the plasma processing chamber 524 includes a showerhead 514 for delivering process gases and a pedestal 518 for supporting a wafer. The plasma processing chamber 524 can be a CCP reactor, where the showerhead 514 includes a top electrode and the pedestal 518 includes a bottom electrode. The integrated apparatus 500 can include multiple power sources for supplying RF power to the showerhead 514 and the pedestal 518. In some implementations, the integrated apparatus 500 can include an LFRF generator 504 and an HFRF generator 502. The LFRF generator 504 and the HFRF generator 502 may be operatively coupled to the showerhead 514 or the pedestal 518 via one or more switches 564, 568. As used herein, components that are "operatively coupled" with one another refer to components that are in electrical connection or otherwise coupled with one another depending on the operations of a controlling device (e.g., switch, system controller, etc.). The integrated apparatus 500 can include one or more switches 564, 568 operatively coupled to one or both of the LFRF generator 504 and the HFRF generator 502. The switches 564, 568 may be configured to switch between (1) a deposition mode for performing a deposition process, where the switches 564, 568 couple at least the HFRF generator 502 to the showerhead 514, and (2) an etch mode for performing an etch process, where the switches 564, 568 couple at least the LFRF generator 504 and the HFRF generator 502 to the pedestal 518 and grounds the showerhead 514. When the HFRF generator 502 is coupled to the showerhead 514 in the deposition mode, the HFRF generator 502 can deliver RF power to the showerhead 514. When the HFRF generator 502 and the LFRF generator 504 are coupled to the pedestal 518 in the etch mode, the HFRF generator 502 and the LFRF generator 504 can deliver RF power to the pedestal 518.

Figure 5B:
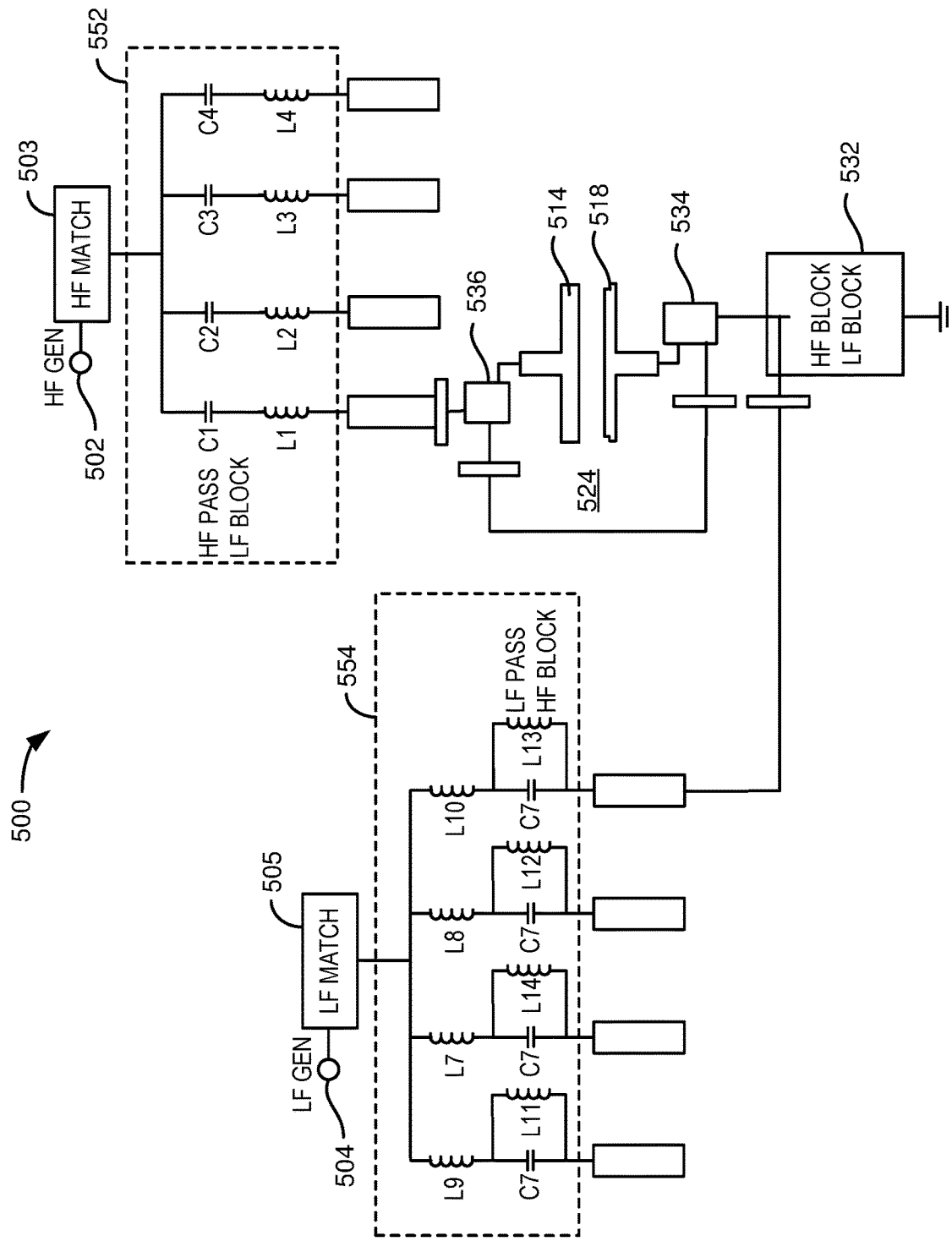

In FIG. 5A, the switches 564, 568 can be replaced by filters 534, 536 as shown in FIG. 5B, where the filters 534 536 can switch between (1) a deposition mode for performing a deposition process, where the filters 534 536 couple selectively pass high-frequency signals to the showerhead 514, and (2) an etch mode for performing an etch process, where the filters 534 536 selectively pass one or both high-frequency and low-frequency signals to the pedestal 518.

As shown in FIG. 5A, the one or more switches 564, 568 include a first station relay switch 564 configured to couple the LFRF generator 504 and the HFRF generator 502 to the showerhead 514 in the deposition mode. In a first position, the first station relay switch 564 electrically connects the LFRF generator 504 and the HFRF generator 502 to the showerhead 514. That way, the showerhead 514 is powered in the deposition mode. In a second position, the first station relay switch 564 is electrically grounded, so that the showerhead 514 is electrically grounded. As shown in FIG. 5A, the one or more switches 564, 568 include a second station relay switch 568 configured to couple the HFRF generator 502 and the LFRF generator 504 to the pedestal 518 in the etch mode. In a first position, the second station relay switch 568 electrically connects the HFRF generator 502 and the LFRF generator 504 to the pedestal 518. That way, the pedestal 518 is biased in the etch mode. In a second position, the second station relay switch 568 is electrically grounded, so that the pedestal 518 is electrically grounded.

In some implementations as shown in FIGS. 5A and 5B, the integrated apparatus 500 can include a low-frequency match unit 505 (or low-frequency impedance matching network 505) coupled to the LFRF generator 504. In some embodiments, the integrated apparatus 500 can include a high-frequency match unit 503 (or high-frequency impedance matching network 503) coupled to the HFRF generator 502. In some implementations, the integrated apparatus 500 can further include one or more filters to selectively pass high or low frequency signals. The integrated apparatus 500 can include a low-pass filter 554 coupled to the low-frequency match unit 505, and a high-pass filter 552 coupled to the high-frequency match unit 503. In some embodiments, each of the low-pass filter 554 and the high-pass filter 552 includes one or more capacitors and inductors. The low-pass filter 554 can prevent high-frequency signals from getting back to the LFRF generator 504, and the high-pass filter 552 can prevent low-frequency signals from getting back to the HFRF generator 502. In some implementations, each of the low-pass filter 554 and the high-pass filter 552 can serve as RF filters for multiple plasma processing chambers, and not just the plasma processing chamber 524. In some implementations, a blocking filter 532 can be inserted between the LFRF generator 504 and both the pedestal 518 and the showerhead 514 to selectively block high-frequency signals or low-frequency signals. The blocking filter 532 can function similarly to the blocking capacitor 432 in the RF hardware configuration of FIG. 4B.

In FIG. 5A, the integrated apparatus 500 is selectively switchable between a deposition mode and an etch mode. In the deposition mode according to certain embodiments, the first station relay switch 564 is switched to the first position so that the LFRF generator 504 and the HFRF generator 502 is electrically connected to the showerhead 514, and the second station relay switch 568 is simultaneously switched to the second position so that the pedestal 518 is grounded. Such a configuration may be utilized for ALD. In the deposition mode according to alternative implementations, the first station relay switch 564 is switched to the first position so that the LFRF generator 504 and the HFRF generator 502 are electrically connected to the showerhead 514, and the second station relay switch 568 is simultaneously switched to the first position so that the LFRF generator 504 and the HFRF generator 502 is electrically connected to the pedestal 518. In some implementations, the blocking filter 532 can prevent low-frequency signals from reaching the showerhead 514. In the etch mode according to certain implementations, the second station relay switch 568 is switched to the first position so that the LFRF generator 504 and the HFRF generator 502 are electrically connected to the pedestal 518, and the first station relay switch 564 is simultaneously switched to the second position so that the showerhead 514 is grounded. In some implementations, the blocking filter 532 can prevent low-frequency or high-frequency signals from reaching the pedestal 518. In some implementations, both low-frequency and high-frequency signals can be used to bias the pedestal 518 in the etch mode.

The RF hardware configuration of FIG. 5A may optimize deposition and etch modes using switches 564, 568 so that deposition-etch-deposition sequences can be performed in a single integrated apparatus 500. Additionally, the RF hardware configuration of FIGS. 5A and 5B may utilize multiple integrated circuit boards (e.g., splitter boards) to accommodate both the HFRF generator 502 and the LFRF generator 504. The splitter board allows signal to be distributed not only to one plasma processing chamber, such as the plasma processing chamber 524, but to multiple plasma processing chambers. Each splitter board can include multiple stations with multiple channels. One splitter board can include the LFRF generator 504, the low-frequency match unit 505, and the low-pass filter 554, and another splitter board can include the HFRF generator 502, the high-frequency match unit 503, and the high-pass filter 552. In some implementations, the switches 564, 568 may be relay switches capable of at least 4 million, at least 20 million, or at least 25 million cycles.

Figure 6:
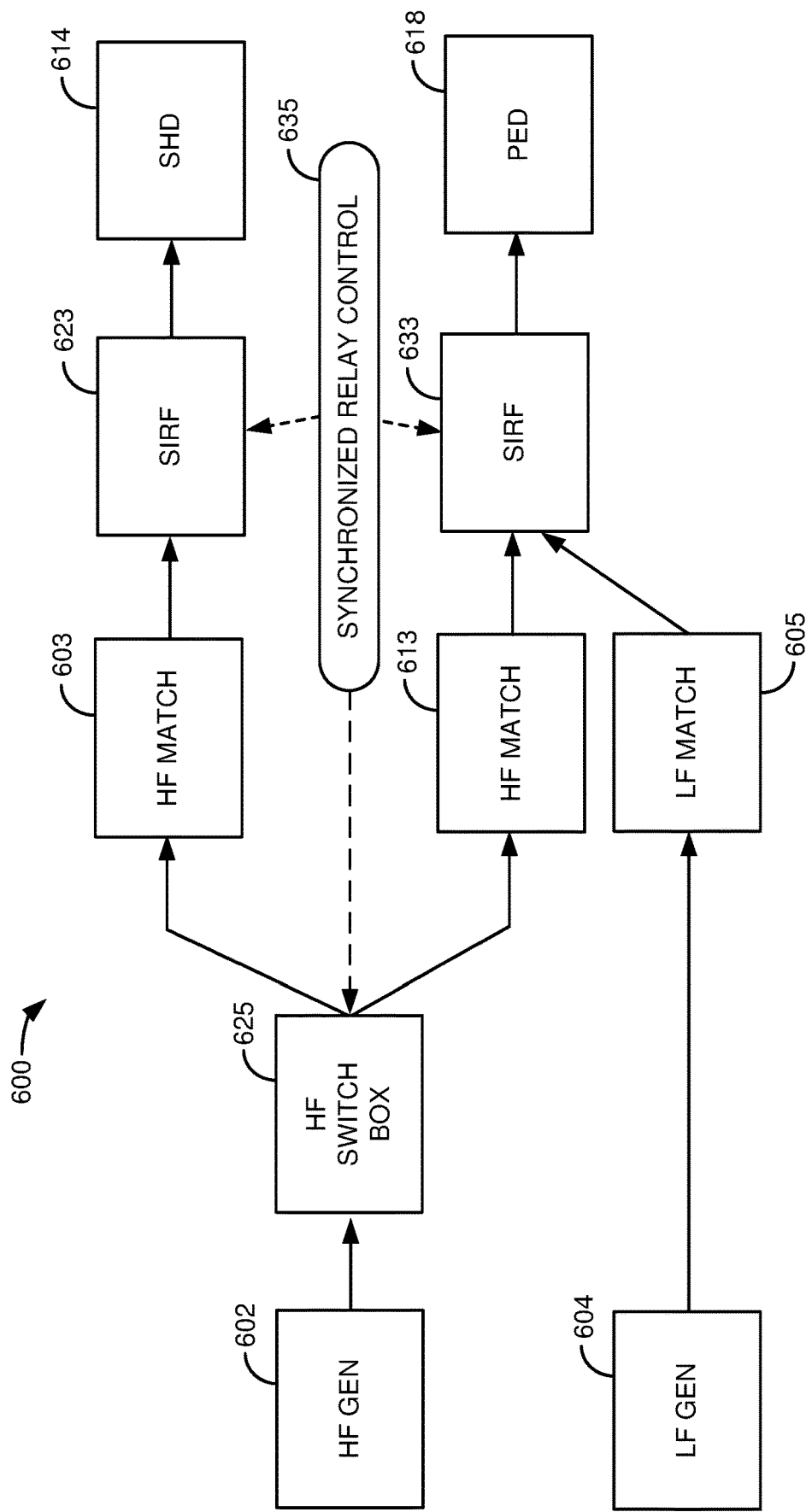
FIG. 6 shows a block diagram of an example scheme for switching between a deposition mode and an etch mode according to some implementations.

FIG. 6 shows a block diagram of an example scheme for switching between a deposition mode and an etch mode according to some implementations. Like the RF hardware configuration shown in FIGS. 5A and 5B, an integrated apparatus 600 can include a showerhead 614, a pedestal 618, an HFRF generator 602, an LFRF generator 604, and multiple integrated circuit boards 623, 633 (e.g., splitter boards). The HFRF generator 602 and the LFRF generator 604 may be operatively coupled to the showerhead 614 and the pedestal 618. The integrated apparatus 600 includes a switch 625 operatively coupled to the HFRF generator 602. The switch 625 may be configured to switch between (1) a deposition mode for performing deposition processes, where the switch 625 couples the HFRF generator 602 to the showerhead 614, and (2) an etch mode for performing an etch process, where the switch 625 couples at least the LFRF generator 604 and the HFRF generator 602 to the pedestal 618 and grounds the showerhead 614.

In FIG. 6, the integrated apparatus 600 can include a first integrated circuit board 623 and a first high-frequency match unit 603 associated with the deposition mode. In the deposition mode, the HFRF generator 602 is electrically connected to the showerhead 614 via the switch 625, so that the HFRF generator 602, the first high-frequency match unit 603, and the first integrated circuit board 623 are in electrical connection with the showerhead 614. The HFRF generator 602 and the first high-frequency match unit 603 can deliver power to the showerhead 614 in the deposition mode. In some implementations, the pedestal 618 is grounded in the deposition mode.

In FIG. 6, the integrated apparatus 600 can include a second integrated circuit board 633 and a low-frequency match unit 605 as well as a second high-frequency match unit 613 associated with the etch mode. In the etch mode, the LFRF generator 604 is electrically connected to the pedestal 618, and the HFRF generator 602 is electrically connected to the pedestal 618 via the switch 625. That way, the HFRF generator 602, the second high-frequency match unit 613, the LFRF generator 604, the low-frequency match unit 605, and the second integrated circuit board 633 are in electrical connection with the pedestal 618. The HFRF generator 602 and the second high-frequency match unit 613 as well as the LFRF generator 604 and the low-frequency match unit 605 deliver power to the pedestal 618 in the etch mode. In some implementations, the showerhead 614 is grounded in the etch mode.

In some implementations, the switch 625 is an HFRF switchbox configured to switch between delivering power from the HFRF generator 602 to the showerhead 614 in the deposition mode, and delivering power from the HFRF generator 602 to the pedestal 618 in the etch mode. In the deposition mode, only the HFRF generator 602 is coupled to the showerhead 614 through the first integrated circuit board 623. In the etch mode, both the HFRF generator 602 and the LFRF generator 604 are coupled to the pedestal 618 through the second integrated circuit board 633. In some implementations, the first integrated circuit board 623 and the second integrated circuit board 633 are communicatively coupled via a synchronized relay control 635, and the synchronized relay control 635 is communicatively coupled to the switch 625. The synchronized rely control 635 is configured to synchronize switching between the deposition and etch modes. For example, if the first integrated circuit board 623 is delivering power to the showerhead 614 from the HFRF generator 602 in the deposition mode, then the synchronized relay control 635 can simultaneously communicate to the second integrated circuit board 633 to not deliver power to the pedestal 618. Or, if the second integrated circuit board 633 is delivering power to the pedestal 618 from the HFRF generator 602 and the LFRF generator 604 in the etch mode, then the synchronized relay control 635 can simultaneously communicate to the first integrated circuit board 623 to not deliver power to the showerhead 614.

Whereas the RF hardware configurations in FIGS. 5 and 6 utilize an HFRF generator, an LFRF generator, and separate integrated circuit boards for powering a showerhead and/or pedestal, some RF hardware configurations may mix together the HFRF generator and the LFRF generator as a single power supply source and utilize a single integrated circuit board for powering a showerhead and/or pedestal. In some implementations, the HFRF generator and the LFRF generator may be part of a single integrated circuit board. The single integrated circuit board can deliver high-frequency and/or low frequency signals to a showerhead in one mode, and deliver high-frequency and/or low frequency signals to a pedestal in another mode. The single integrated circuit board can include multiple stations with multiple channels.

Figure 7:
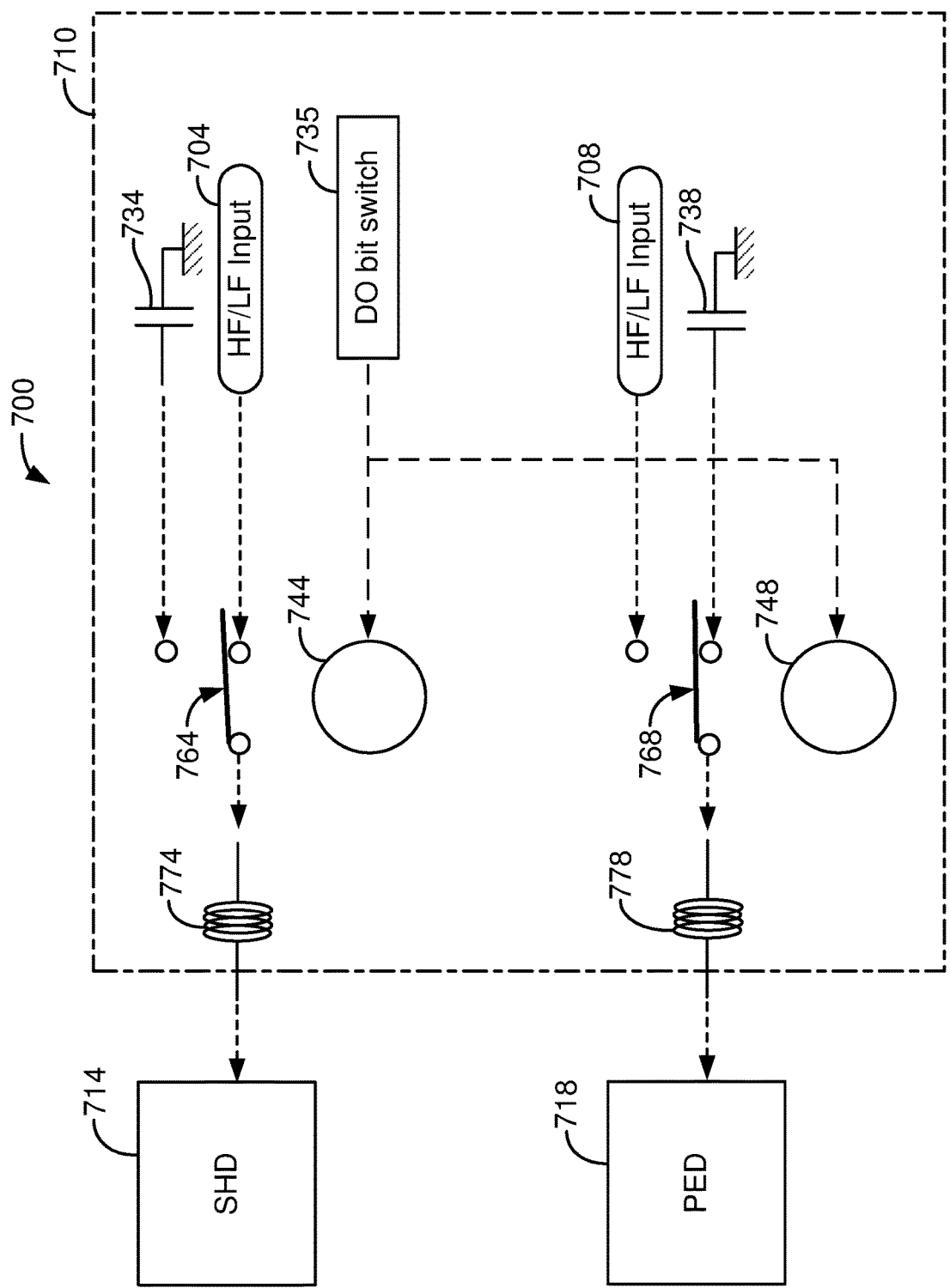
FIG. 7 shows a block diagram of an alternative example scheme for switching between a deposition mode and an etch mode according to some implementations.

FIG. 7 shows a block diagram of an alternative example scheme for switching between a deposition mode and an etch mode according to some implementations. An integrated apparatus 700 can include an integrated circuit board 710, a showerhead 714, and a pedestal 718. The showerhead 714 and the pedestal 718 may be part of a plasma processing chamber (not shown) for performing deposition-etch-deposition sequences on a wafer. The plasma processing chamber can be a CCP reactor, where the showerhead 714 includes a top electrode and the pedestal 718 includes a bottom electrode. The integrated circuit board 710 can include one or more HF/LF RF generators 704, 708 and one or more switches 764, 768, where the one or more switches 764, 768 are configured to switch between (1) a deposition mode for performing a deposition process, where the one or more switches 764, 768 in the deposition mode couples the HF/LF generator 704 to the showerhead 714, and (2) an etch mode for performing an etch process, where the one or more switches 764, 768 in the etch mode couples the HF/LF generator 708 to the pedestal 718. In some implementations, the HF/LF RF generator(s) 704, 708 shown in FIG. 7 can be a single HF/LF RF generator. A single HF/LF RF generator can be capable of delivering both high-frequency and low-frequency signals. The same HF/LF RF generator can be used to power the showerhead 714 or the pedestal 718.

In some embodiments, the integrated circuit board 710 can be outfitted with multiple channels to power up multiple stations. At one of the stations can be a first station relay switch 764, and at one of the other stations can be a second station relay switch 768. The first station relay switch 764 is configured to couple a first HF/LF RF generator 704 to the showerhead 714 in the deposition mode. When the first station relay switch 764 is in a first position, the integrated apparatus 700 is in the deposition mode and the first HF/LF RF generator 704 is electrically connected to the showerhead 714 to power the showerhead 714. The signal from the HF/LF RF generator 704 passes through a first inductor 774 to the showerhead 714. When the first station relay switch 764 is in a second position, the showerhead 714 is grounded. In some implementations, a first capacitor 734 is provided when the showerhead 714 is grounded to compensate for the inductance in the return path. The second station relay switch 768 is configured to couple a second HF/LF RF generator 708 to the pedestal 718 in the etch mode. When the second station relay switch 768 is in a first position, the integrated apparatus 700 is in the etch mode and the second HF/LF RF generator 708 is electrically connected to the pedestal 718 to bias the pedestal 718. The signal from the second station relay switch 768 passes through a second inductor 778 to the pedestal 718. When the second station relay switch 768 is in a second position, the pedestal 718 is grounded. In some implementations, a second capacitor 738 is provided when the pedestal 718 is grounded to compensate for the inductance in the return path.

In some embodiments as shown in FIG. 7, the integrated circuit board 710 includes a switch 735, such as a digital output (DO) bit switch, configured to synchronize switching between modes. The switch 735 can be coupled to a first relay 744 and a second relay 748. In some implementations, each of the first relay 744 and the second relay 748 can be a high voltage vacuum relay. When the switch 735 is in a deposition mode, the first relay 744 can be in an open position and the second relay 748 can be in a closed position. When the switch is in an etch mode, the first relay 744 can be in a closed position and the second relay 748 can be in an open position. When the first relay 744 is opened and the second relay 748 is closed, the first station relay switch 764 is in the first position and the second station relay switch 768 is in the second position so that the showerhead 714 is powered and the pedestal 718 is grounded. When the first relay 744 is closed and the second relay 748 is opened, the first station relay switch 764 is in the second position and the second station relay switch 768 is in the first position so that the pedestal 718 is powered and the showerhead 714 is grounded. Such an arrangement in FIG. 7 allows for the HF/LF RF generator(s) 704, 708 to power the showerhead 714 and ground the pedestal 718 in the deposition mode, or for the HF/LF RF generator(s) 704, 708 to power the pedestal 718 and ground the showerhead 714 in the etch mode.

The showerhead 714 in FIG. 7 may be grounded through a coaxial cable (not shown) positioned between the showerhead 714 and the first inductor 774. The pedestal 718 in FIG. 7 may also be grounded through a coaxial cable positioned between the pedestal 718 and the second inductor 778. However, grounding through an inductor and a coaxial cable creates a longer return path to electrical ground. This can cause more voltage to build up on either the showerhead 714 or the pedestal 718, which can effectively reduce the voltage between electrodes. This can cause the etch mode, for example, to be less effective if the pedestal 718 is biased yet the voltage between the electrodes change.

Figure 8:
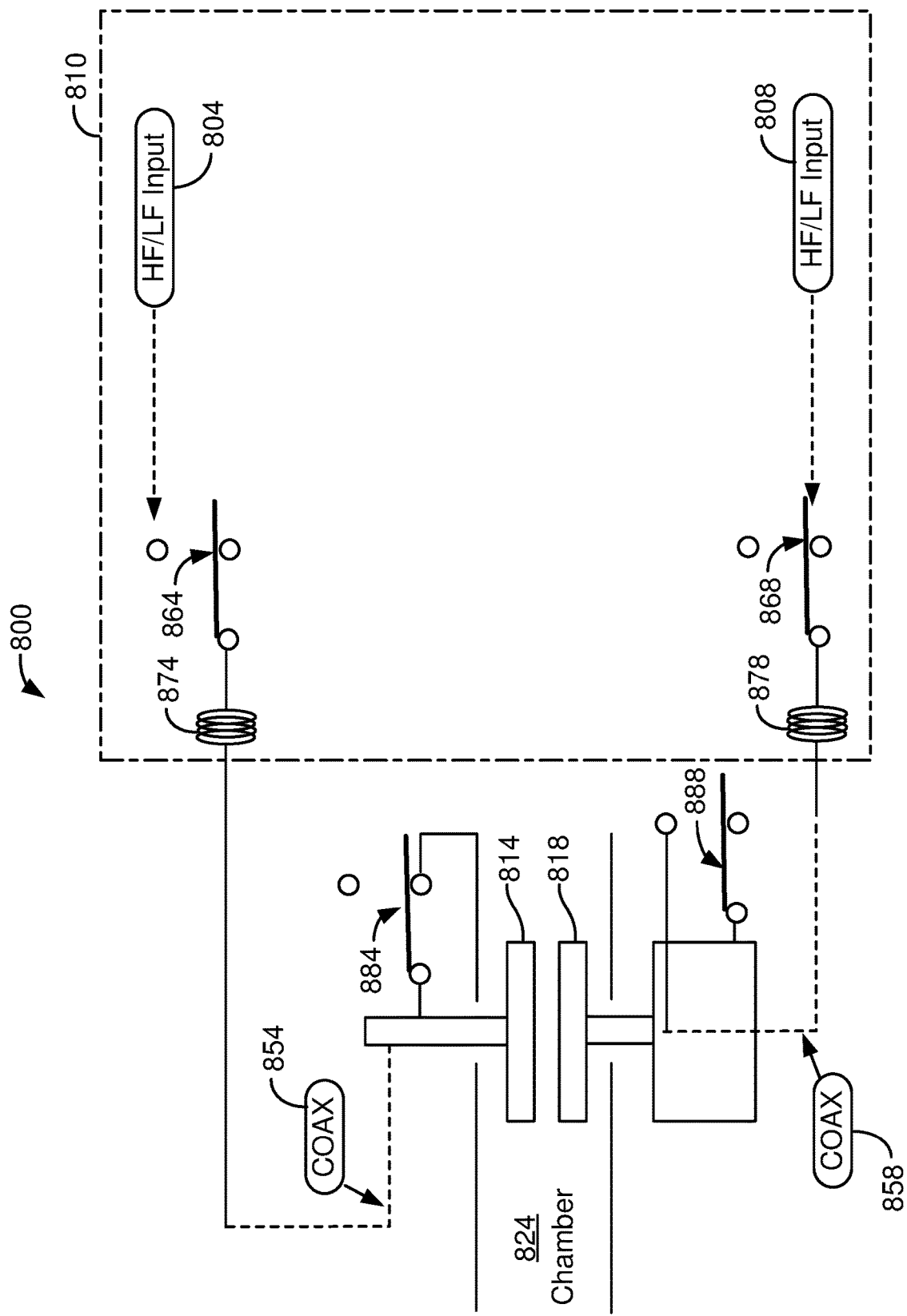
FIG. 8 shows a schematic illustration of an example integrated apparatus including a plasma processing chamber configured to switch between a deposition mode and an etch mode according to some implementations.

Rather than grounding through an inductor and a coaxial cable, some RF hardware configurations may ground the showerhead and the pedestal local to the plasma processing chamber. FIG. 8 shows a schematic illustration of an example integrated apparatus including a plasma processing chamber configured to switch between a deposition mode and an etch mode according to some implementations. An integrated apparatus 800 includes an integrated circuit board 810 and a plasma processing chamber 824, where the plasma processing chamber 824 includes a showerhead 814 and a pedestal 818. The plasma processing chamber 824 may be a CCP reactor, where the showerhead 814 includes a top electrode and the pedestal 818 includes a bottom electrode. The CCP reactor may be configured to perform deposition-etch-deposition sequences on a wafer. The integrated circuit board 810 can include one or more HF/LF RF generators 804, 808 and one or more switches 864, 868. The integrated apparatus 800 can further include additional switches 884, 888. The switches 864, 868, 884, 888 are configured to switch between (1) a deposition mode for performing a deposition process, where the switches 864, 868, 884, 888 in the deposition mode couple the HF/LF RF generator 804 to the showerhead 814 and ground the pedestal 818, and (2) an etch mode for performing an etch process, where the switches 864, 868, 884, 888 in the etch mode couple the HF/LF RF generator 808 to the pedestal 818 and ground the showerhead 814. In some implementations, the HF/LF RF generator(s) 804, 808 shown in FIG. 8 can be a single HF/LF RF generator. A single HF/LF RF generator can be capable of delivering both high-frequency and low-frequency signals. The same HF/LF RF generator can be used to power the showerhead 814 or the pedestal 818.

In some implementations, the integrated circuit board 810 can be outfitted with multiple channels to power up multiple stations. At one of the stations can be a first station relay switch 864, and at one of the other stations can be a second station relay switch 868. The first station relay switch 864 is configured to couple a first HF/LF RF generator 804 to the showerhead 814 in the deposition mode. When the first station relay switch 864 is in a first position, the integrated apparatus 800 is in the deposition mode and the first HF/LF RF generator 804 is electrically connected to the showerhead 814 to power the showerhead 814. The signal from the HF/LF RF generator 804 passes through a first inductor 874 to the showerhead 814. When the first station relay switch 864 is in a second position, the showerhead 814 is grounded. However, rather than grounding through the first inductor 874 and a first coaxial cable 854, the showerhead 814 is grounded locally to the plasma processing chamber 824. A showerhead grounding relay switch 884 is provided local to the showerhead 814 and is coupled to a first station associated with the first station relay switch 864. This reduces the inductance in the return path and can eliminate the need for compensation capacitors. The second station relay switch 868 is configured to couple a second HF/LF RF generator 808 to the pedestal 818 in the etch mode. When the second station relay switch 868 is in a first position, the integrated apparatus 800 is in the etch mode and the second HF/LF RF generator 808 is electrically connected to the pedestal 818 to bias the pedestal 818. The signal from the second station relay switch 868 passes through a second inductor 878 to the pedestal 818. When the second station relay switch 868 is in a second position, the pedestal 818 is grounded. However, rather than grounding through the second inductor 878 and a second coaxial cable 858, the pedestal 818 is grounded locally to the plasma processing chamber 824. A pedestal grounding relay switch 888 is provided local to the pedestal 818 and is coupled to a second station associated with the second station relay switch 868. This reduces the inductance in the return path and can eliminate the need for compensation capacitors. In some implementations, locally grounding the electrodes can improve the etch process in the etch mode. However, each station in FIG. 8 is outfitted with two relay switches instead of one, such as having relay switches 864, 884 at a first station and relay switches 868, 888 at a second station.

The integrated circuit board 810 (e.g., splitter board) can include multiple stations, where each station is capable of switching the power on/off. The integrated circuit board 810 can include a DO bit switch (not shown) at one of the stations, where the DO bit switch is configured to synchronize switching between modes. Thus, all four relay switches 864, 868, 884, 888 can be synchronized. For example, if the DO bit switch is provided at a first station associated with the first station relay switch 864, and if the first station relay switch 864 is switched to the first position (e.g., turned on), then the showerhead 814 is powered and the pedestal 818 is grounded. Specifically, the second station relay switch 868 is switched to the second position (e.g., turned off), and the pedestal grounding relay switch 888 locally grounds the pedestal 818. If the first station relay switch 864 is switched to the second position (e.g., turned off), then the pedestal 818 is powered and the showerhead 814 is grounded. Specifically, the second station relay switch 868 is switched to the first position (e.g., turned on), and the showerhead grounding relay switch 884 locally grounds the showerhead 814. Such an arrangement in FIG. 8 allows for the HF/LF RF generator(s) 804, 808 to power the showerhead 814 and ground the pedestal 818 in the deposition mode, or for the HF/LF RF generator(s) 804, 808 to power the pedestal 818 and ground the showerhead 814 in the etch mode.

Figure 9A:
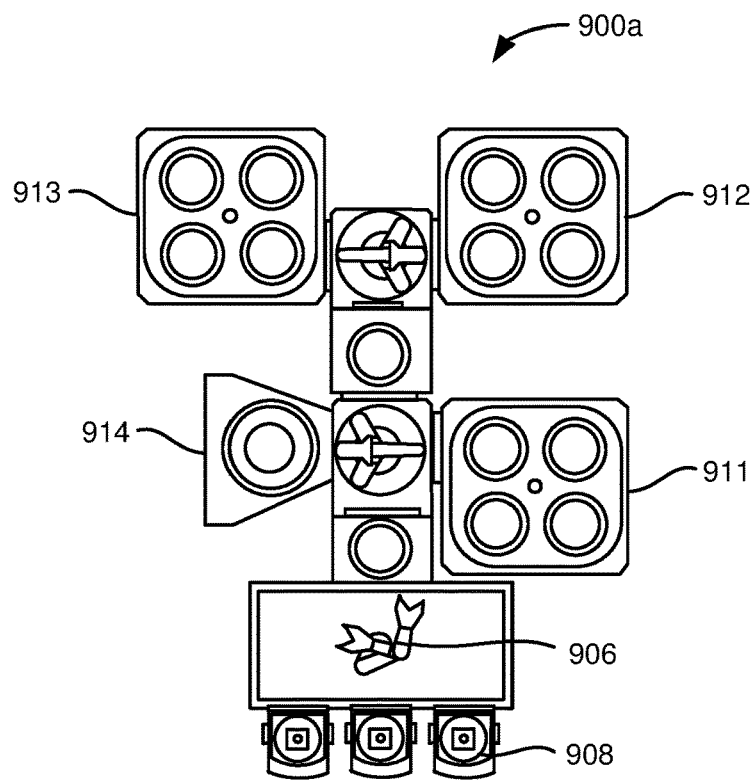
FIG. 9A shows a schematic illustration of an example conventional multi-station processing tool for carrying out deposition-etch-deposition gap fill processes.

The aforementioned RF hardware configurations in integrated apparatuses described in FIGS. 5-8 can provide a simpler and more flexible tool solution for performing deposition-etch-deposition sequences than conventional tools. FIG. 9A shows a schematic illustration of an example conventional multi-station processing tool for carrying out deposition-etch-deposition gap fill processes. A multi-station processing tool 900a includes a robot 906 configured to move wafers from a cassette loaded through a pod 908 into a load lock and ultimately into one of four process chambers 911, 912, 913, 914, though it is understood that there may be fewer or more process chambers. The multi-station processing tool 900a can include similar features as the multi-station processing tool 300 in FIG. 3. In the multi-station processing tool 900a, three of the process chambers 911, 912, 913 may be configured to perform deposition processes, such as ALD, and one of the process chambers 914 may be configured to perform an etch process.

Figure 9B:
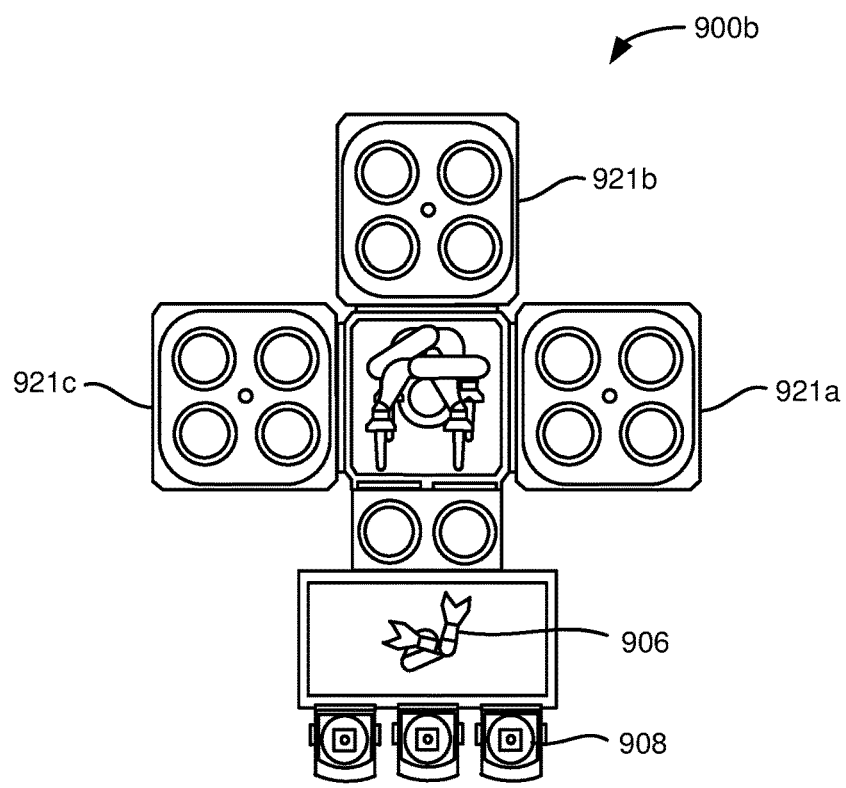
FIG. 9B shows a schematic illustration of an example multi-station processing tool including a disclosed integrated apparatus for carrying out deposition-etch-deposition gap fill processes.

FIG. 9B shows a schematic illustration of an example multi-station processing tool including a disclosed integrated apparatus for carrying out deposition-etch-deposition gap fill processes. A multi-station processing tool 900b includes a robot 906 configured to move wafers from a cassette loaded through a pod 908 into a load lock and ultimately into one of three process chambers 921a, 921b, 921c, though it is understood that there may be fewer or more process chambers. The multi-station processing tool 900b can include similar features as the multi-station processing tool 300 in FIG. 3. In the multi-station processing tool 900b, each of the process chambers 921a, 921b, 921c may be configured to perform both deposition and etch processes. For example, each of the process chambers 921a, 921b, 921c may incorporate an integrated apparatus with a certain RF hardware configuration shown in FIGS. 5-8. The multi-station processing tool 900b may provide for fast frequency tuning for deposition processes, high etch rates for etch processes, tapered etch profiles for etch processes, and improved flexibility by performing multiple deposition-etch-deposition sequences for gap fill in the same chamber.

The multi-station processing tool 900b may include a system controller (not shown), such as the system controller 350 in FIG. 3. The system controller may be configured to provide instructions for performing operations, including the operations of switching between deposition and etch modes. The system controller may be part of a system, which may be part of an integrated apparatus. The system controller may provide program instructions for operating in deposition and etch modes using any of the above-described RF hardware configurations in FIGS. 5-8. The system controller may include instructions for controlling RF power levels, RF frequencies, duty cycle, wafer temperature, chamber and/or station temperature, chamber and/or station pressure, wafer and/or pedestal position, timing, mixture of gases, gas flow rates, purge conditions and timing, deposition and etch mode switching, etc.

Broadly speaking, the system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, surfaces, circuits, and/or dies of a wafer.

The system controller, in some implementations, may be a part of or coupled to a computer that is integrated with, coupled to the system, otherwise networked to the system, or a combination thereof. For example, the system controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller receives instructions in the form of data, which specify parameters for each of the processing steps to be performed during one or more operations. It should be understood that the parameters may be specific to the type of process to be performed and the type of tool that the system controller is configured to interface with or control. Thus as described above, the system controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Depending on the process step or steps to be performed by the tool, the system controller may communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory. The system controller may be configured with instructions to perform one or more of the operations described below.

Process Conditions

Figure 10:
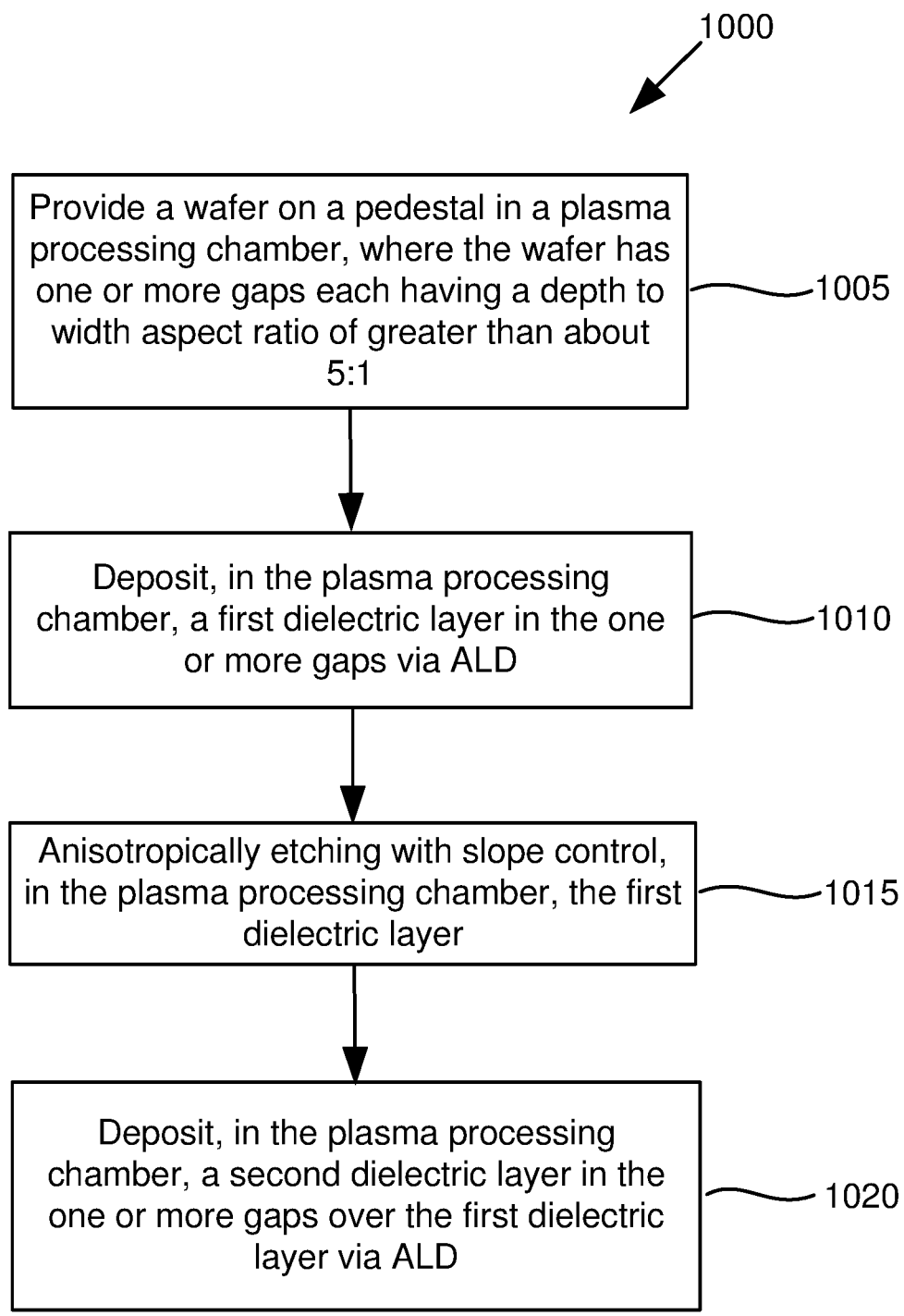
FIG. 10 shows a flow diagram illustrating an example process flow for performing a deposition-etch-deposition gap fill process on a wafer.

FIG. 10 shows a flow diagram illustrating an example process flow for performing a deposition-etch-deposition gap fill process on a wafer. The operations in a process 1000 may be performed in different orders and/or with different, fewer, or additional operations. A system controller as described above may be configured with instructions to perform one or more of the following operations.

With an integrated tool solution provided in FIGS. 5-9B for deposition and etch processes, deposition-etch-deposition gap fill processes can be performed in the same plasma processing chamber throughout. Furthermore, the process conditions for performing etch processes can be compatible with the process conditions for performing deposition processes. In some implementations, process conditions such as wafer temperature, chamber pressure, frequency, and RF power may be adjusted to be compatible with deposition processes yet still provide an effective anisotropic etch in a deposition-etch-deposition sequence.

The process 1000 can being at block 1005, where a wafer is provided in a plasma processing chamber, where the wafer has one or more gaps each having a depth to width aspect ratio of greater than about 5:1. The wafer can be a semiconductor wafer as used in the production of integrated circuits. The wafer can have one or more features so that the wafer is non-planar. In some implementations, the one or more features can include one or more gaps, trenches, or recesses. A gap fill process can be performed on the wafer with one or more gaps. The gap width in the wafer can vary according to various embodiments, which may range from about 5 Å to about 50 µm, or from about 100 Å to about 1 µm. Examples of depth to width aspect ratios can be greater than about 2:1, or greater than about 5:1, or greater than about 10:1, or greater than about 30:1, or greater than about 50:1, or greater than about 100:1. Moreover, the plasma processing chamber can be a CCP reactor including a showerhead for delivering process gases and a pedestal for supporting the wafer, where the showerhead includes a top electrode and the pedestal includes a bottom electrode.

At block 1010 of the process 1000, a first dielectric layer can be deposited in the one or more gaps via ALD in the plasma processing chamber. In some implementations, the first dielectric layer can be a dielectric oxide, such as silicon dioxide ($SiO_2$). With ALD, a conformal film of the first dielectric layer can be deposited on the non-planar wafer. During deposition of the first dielectric layer via ALD, the plasma processing chamber can be in a deposition mode where at least the showerhead is powered by an RF generator. In some implementations, the pedestal can be grounded during deposition of the first dielectric layer. In some implementations, the RF generator may be capable of fast frequency tuning.

At block 1015 of the process 1000, the first dielectric layer is anisotropically etched with slope control in the plasma processing chamber. The anisotropic etch creates a tapered positive slope in the as-deposited film of the first dielectric layer. The anisotropic etch can selectively remove more dielectric material near the top of the gap than inside and near the bottom of the gap. For the purposes of this description, "near the top of the gap" or "near the opening" is defined as an approximate position or an area within the gap (i.e., along the sidewall of the gap) corresponding to about 0-10% of the gap depth measured from the field region. In certain embodiments, the area near the opening or near the top of the gap corresponds to the area at the opening or at the top of the gap. Further, "inside and near the bottom of the gap" or "inside the gap" is defined as an approximate position or an area within the gap corresponding to between about 20-60% of the gap depth from the field region on the top of the gap. Typically, when values for certain parameters (e.g., thicknesses) are specified "near the opening" or "inside the gap", these values represent a measurement or an average of multiple measurements taken within these positions/areas. The anisotropic etch is performed with slope control so as to create a sloped profile near the top of the gap than inside and near the bottom of the gap. In some implementations, the etchant for the anisotropic etch can include a fluorine-based etchant, such as nitrogen trifluoride ($NF_3$).

The anisotropic etch step performed at block 1015 can occur in the same plasma processing chamber as the deposition step performed at block 1010. In some embodiments, the plasma processing chamber at block 1015 can be in an etch mode, where the pedestal is powered by an RF generator and the showerhead is grounded. In some implementations, one or more switches may be utilized to switch the RF generator from powering the showerhead in the deposition mode to powering the pedestal in the etch mode. For example, the process 1000 can further include switching to apply a low-frequency power and a high-frequency power to the pedestal in the plasma processing chamber and to ground a showerhead in the plasma processing chamber prior to anisotropically etching the first dielectric layer.

Process conditions for the deposition mode at block 1010 may be compatible with process conditions for the etch mode at block 1015. In some implementations, the wafer temperature during both etch and deposition processes may be between 50° C. and 650° C., or greater than 100° C., or greater than 200° C., or greater than 300° C., or even greater than 400° C. Such wafer temperature ranges may apply at block 1010, 1015, and 1020. In some implementations, chamber pressure for both etch and deposition processes can be between 0.1 Torr and 10 Torr, or between 0.3 Torr and 1 Torr. Such chamber pressures may apply at block 1010, 1015, and 1020. In some implementations, the LFRF generator can provide an RF frequency of about 400 kHZ, and the HFRF generator can provide an RF frequency of about 13.56 MHz. Such frequencies may apply at block 1010, 1015, and 1020. The generated low-frequency power can be between about 1500 W and about 6000 W, and the generated high-frequency power can be between about 0 W and about 5000 W. Such RF powers may apply at block 1010, 1015, and 1020. Typical etch processes do not operate at such high wafer temperatures and do not operate at such low frequencies to generate such large low-frequency powers. In some implementations, the concentration of $NF_3$ may be between about 1.0-2.5% for etching. Typical etch processes may also not use such small amounts of $NF_3$ for etching. Table I provides an example set of wafer temperature ranges, gas mixtures, gas concentrations in terms of flow rate, pressure, high-frequency power, low-frequency power, and $NF_3$ concentration.

TABLE I

| Wafer Temperature (° C.) | NF$_3$ (sccm) | He (sccm) | Ar (sccm) | O$_2$ (sccm) | Pressure (Torr) | 13.56 MHz HF Power (W) | 400 kHz LF Power (W) | NF$_3$ (%) |
|---|---|---|---|---|---|---|---|---|
| 80-400 | 250 | 2500 | 5000 | 2500 | 0.6 | 2000 | 3000 | 2.44 |
|  | 250 | 5000 | 5000 | 0 | 0.6 | 2000 | 3000 | 2.44 |
|  | 250 | 2500 | 5000 | 2500 | 0.6 | 0 | 3000 | 2.44 |
|  | 250 | 0 | 5000 | 5000 | 0.6 | 0 | 3000 | 2.44 |
|  | 125 | 0 | 2500 | 2500 | 0.3 | 0 | 3000 | 2.44 |
|  | 125 | 0 | 2500 | 2500 | 0.3 | 2000 | 3000 | 2.44 |
|  | 250 | 2500 | 5000 | 2500 | 0.6 | 2000 | 3000 | 2.44 |
|  | 50 | 2500 | 2500 | 0 | 0.3 | 1000 | 3000 | 0.99 |
|  | 125 | 2500 | 2500 | 0 | 0.3 | 1000 | 3000 | 2.44 |
|  | 50 | 2500 | 2500 | 0 | 1.0 | 1000 | 3000 | 0.99 |
|  | 125 | 2500 | 2500 | 0 | 1.0 | 1000 | 3000 | 2.44 |
|  | 50 | 2500 | 2500 | 0 | 0.3 | 700 | 1600 | 0.99 |

| Wafer Temperature (° C.) | NF$_3$ (sccm) | He (sccm) | Ar (sccm) | N$_2$ (sccm) | Pressure (Torr) | HF Power (W) | LF Power (W) | NF$_3$ (%) |
|---|---|---|---|---|---|---|---|---|
| 80-400 | 250 | 2500 | 5000 | 2500 | 0.6 | 2000 | 3000 | 2.44 |
|  | 250 | 2500 | 5000 | 2500 | 0.6 | 0 | 3000 | 2.44 |
|  | 250 | 0 | 5000 | 5000 | 0.6 | 0 | 3000 | 2.44 |
|  | 125 | 0 | 2500 | 2500 | 0.3 | 0 | 3000 | 2.44 |
|  | 125 | 0 | 2500 | 2500 | 0.3 | 2000 | 3000 | 2.44 |
|  | 250 | 2500 | 5000 | 2500 | 0.6 | 2000 | 3000 | 2.44 |

At block 1020 of the process 1000, a second dielectric layer can be deposited in the one or more gaps over the first dielectric layer via ALD in the plasma processing chamber. In some implementations, the second dielectric layer can be a dielectric oxide, such as SiO$_2$. With ALD, a conformal film of the second dielectric layer can be deposited on the non-planar wafer. In some embodiments, the second dielectric layer can fill and close the one or more gaps. During deposition of the second dielectric layer, the plasma processing chamber can be in the deposition mode where at least the showerhead is powered by an RF generator. In some implementations, the pedestal can be grounded during deposition of the second dielectric layer. The second dielectric layer can be deposited in the same plasma processing chamber as the anisotropic etch with slope control. In some implementations, the process 1000 can further include switching to apply the high-frequency power to the showerhead in the plasma processing chamber and to ground the pedestal in the plasma processing chamber prior to depositing the second dielectric layer.

Lithographic Patterning

The apparatuses/processes described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

OTHER EMBODIMENTS

Although illustrative embodiments and applications of this invention are shown and described herein, many variations and modifications are possible which remain within the concept, scope, and spirit of the invention, and these variations would become clear to those of ordinary skill in the art after perusal of this application. Accordingly, the present embodiments are to be considered as illustrative and not restrictive, and the invention is not to be limited to the details given herein, but may be modified within the scope and equivalents of the appended claims.

What is claimed is:

1. An integrated apparatus for performing deposition and etch processes, the apparatus comprising:
   a process chamber, wherein the process chamber includes a showerhead and a pedestal;
   one or more RF generators; and
   one or more filters operatively coupled to the one or more RF generators, wherein the integrated apparatus is configured to switch between (1) a deposition mode for performing a deposition process, wherein the one or more filters in the deposition mode selectively prevents low-frequency signals to the showerhead and selectively passes high-frequency signals to the showerhead, and (2) an etch mode for performing an etch process, wherein the one or more filters in the etch mode selectively passes high-frequency signals and low-frequency signals to the pedestal.

2. The apparatus of claim 1, wherein the process chamber is a capacitively-coupled plasma (CCP) reactor, and wherein the showerhead includes a top electrode and the pedestal includes a bottom electrode.

3. The apparatus of claim 1, further comprising:
   one or more switches operatively coupled to the one or more RF generators.

4. The apparatus of claim 3, wherein the one or more switches in the deposition mode couple the one or more RF generators to the showerhead.

5. The apparatus of claim 3, wherein the one or more switches in the etch mode couple the one or more RF generators to the pedestal and ground the showerhead.

6. The apparatus of claim 1, wherein the one or more RF generators include an HFRF generator and a LFRF generator.

7. The apparatus of claim 6, wherein the one or more switches include:
- a first station relay switch configured to electrically connect the LFRF generator and the HFRF generator to the showerhead in the deposition mode; and
- a second station relay switch configured to electrically connect the LFRF generator and the HFRF generator to the pedestal in the etch mode.

* * * * *